(12) United States Patent
Zhu

(10) Patent No.: US 12,543,356 B2
(45) Date of Patent: Feb. 3, 2026

(54) SEMICONDUCTOR DEVICE, FABRICATION METHOD FOR SAME, AND ELECTRONIC DEVICE COMPRISING SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 679 days.

(21) Appl. No.: 17/995,907

(22) PCT Filed: Mar. 10, 2021

(86) PCT No.: PCT/CN2021/079955
§ 371 (c)(1),
(2) Date: Oct. 10, 2022

(87) PCT Pub. No.: WO2021/203899
PCT Pub. Date: Oct. 14, 2021

(65) Prior Publication Data
US 2023/0223444 A1 Jul. 13, 2023

(30) Foreign Application Priority Data
Apr. 10, 2020 (CN) .......................... 202010282959.4

(51) Int. Cl.
*H10D 62/17* (2025.01)
*H10D 30/01* (2025.01)
(Continued)

(52) U.S. Cl.
CPC ......... *H10D 62/292* (2025.01); *H10D 30/014* (2025.01); *H10D 30/0217* (2025.01);
(Continued)

(58) Field of Classification Search
CPC ............... H10D 62/292; H10D 30/014; H10D 30/0217; H10D 30/43; H10D 30/6735;
(Continued)

(56) References Cited

U.S. PATENT DOCUMENTS 9,741,811 B2 8/2017 Hatcher et al.
2008/0233693 A1 9/2008 Lee et al.
(Continued)

FOREIGN PATENT DOCUMENTS

CN 101379609 A 3/2009
CN 101427374 A 5/2009
(Continued)

OTHER PUBLICATIONS

International Search Report and Written Opinion dated Jun. 9, 2021, for corresponding PCT Application No. PCT/CN2021/079955.
(Continued)

*Primary Examiner* — Jonathan Han
(74) *Attorney, Agent, or Firm* — Kinney & Lange, P.A.

(57) ABSTRACT

Provided are a semiconductor device, a method of manufacturing the semiconductor device, and an electronic apparatus including the semiconductor device. According to the embodiments, the semiconductor device may include: a vertical structure extending in a vertical direction relative to a substrate; and a nanosheet extending from the vertical structure and spaced apart from the substrate in the vertical direction, wherein the nanosheet includes a first portion in a first orientation, and at least one of an upper surface and a lower surface of the first portion is not parallel to a horizontal surface of the substrate.

37 Claims, 25 Drawing Sheets

(51) Int. Cl.
  *H10D 30/43* (2025.01)
  *H10D 30/67* (2025.01)
  *H10D 62/10* (2025.01)
  *H10D 64/01* (2025.01)
  *H10D 64/66* (2025.01)
  *H10D 84/01* (2025.01)
  *H10D 84/03* (2025.01)
  *H10D 84/85* (2025.01)

(52) U.S. Cl.
  CPC ......... *H10D 30/43* (2025.01); *H10D 30/6735* (2025.01); *H10D 62/121* (2025.01); *H10D 62/371* (2025.01); *H10D 64/017* (2025.01); *H10D 64/679* (2025.01); *H10D 84/0167* (2025.01); *H10D 84/0188* (2025.01); *H10D 84/038* (2025.01); *H10D 84/856* (2025.01)

(58) Field of Classification Search
  CPC .. H10D 62/121; H10D 62/371; H10D 64/017; H10D 64/679; H10D 84/0167; H10D 84/0188; H10D 84/038; H10D 84/856; H10D 30/797; H10D 30/6757; H10D 62/364; H10D 62/822; H10D 62/405; H10D 84/85; H10D 30/021; H10D 30/024; H10D 30/62; H10D 62/118; H10D 84/0193; H10D 84/853; H10D 30/60; B82Y 10/00
  See application file for complete search history.

(56) References Cited

U.S. PATENT DOCUMENTS

| | | | |
|---|---|---|---|
| 2016/0204276 A1 | 7/2016 | Dasgupta et al. | |
| 2016/0359006 A1 | 12/2016 | King Liu et al. | |
| 2017/0170269 A1* | 6/2017 | Balakrishnan | H10D 30/6757 |
| 2019/0035940 A1 | 1/2019 | Hashemi et al. | |
| 2020/0083219 A1* | 3/2020 | Kang | B82Y 10/00 |
| 2020/0365704 A1* | 11/2020 | Chung | H10D 84/0128 |

FOREIGN PATENT DOCUMENTS

| | | |
|---|---|---|
| CN | 101719501 A | 6/2010 |
| CN | 107527911 A | 12/2017 |
| CN | 109411539 A | 3/2019 |
| CN | 110034015 A | 7/2019 |
| CN | 110828378 A | 2/2020 |
| CN | 111446292 A | 7/2020 |
| CN | 111463287 A | 7/2020 |

OTHER PUBLICATIONS

First Chinese Office Action dated Apr. 7, 2023, for corresponding Chinese Application No. 202010282959.4.
First Korean Office Action for corresponding Korean Patent Application No. 10-2022-7038605, dated Oct. 6, 2024, 41 pgs.
Partial Supplementary European Search Report for European Application No. 21784634.4, Dated Jun. 24, 2024, 15 pages.

* cited by examiner

SEMICONDUCTOR DEVICE, FABRICATION METHOD FOR SAME, AND ELECTRONIC DEVICE COMPRISING SAME

CROSS REFERENCE TO RELATED APPLICATION(S)

This application is a Section 371 National Stage Application of International Application No. PCT/CN2021/079955, filed on Mar. 10, 2021, which claims priority to Chinese Patent Application No. 202010282959.4 entitled "Semiconductor device, method of manufacturing the same, and electronic apparatus including the same" filed on Apr. 10, 2020, the entire content of which are incorporated herein by reference in their entirety.

TECHNICAL FIELD

The present disclosure relates to a field of semiconductors, and in particular to a semiconductor device, a method of manufacturing the semiconductor device, and an electronic apparatus including the semiconductor device.

BACKGROUND

Various different structures are proposed to meet a challenge of further miniaturization of semiconductor devices, such as a Fin Field Effect Transistor (FinFET) and a Multi-Bridge Channel Field Effect Transistor (MBCFET). For the FinFET, a further miniaturization may be limited. The MBCFET has a prospect, however, a performance and an integration of the MBCFET is required to be further enhanced.

SUMMARY

In view of this, an object of the present disclosure is, at least in part, to provide a semiconductor device, a method of manufacturing the semiconductor device, and an electronic apparatus including the semiconductor device, so as to optimize a device performance by changing an orientation of a semiconductor surface.

According to an aspect of the present disclosure, there is provided a semiconductor device including: a vertical structure extending in a vertical direction relative to a substrate; and a nanosheet extending from the vertical structure and spaced apart from the substrate in the vertical direction, wherein the nanosheet includes a first portion in a first orientation, and at least one of an upper surface and a lower surface of the first portion is not parallel to a horizontal surface of the substrate.

According to another aspect of the present disclosure, there is provided a semiconductor device, including: a first device and a second device on a substrate, wherein the first device includes a first vertical structure extending in a vertical direction relative to the substrate, and a first nanosheet extending from the first vertical structure and spaced apart from the substrate in the vertical direction. The second device includes a second vertical structure extending in the vertical direction relative to the substrate, and a second nanosheet extending from the second vertical structure and spaced apart from the substrate in the vertical direction. The first nanosheet includes a first portion in a first orientation, and the second nanosheet includes a second portion in a second orientation different from the first orientation.

According to another aspect of the present disclosure, there is provided a method of manufacturing a semiconductor device, including: forming a position maintaining layer on a substrate; forming a pattern on the position maintaining layer, wherein the pattern includes a first surface in a first orientation, and the first surface is not parallel to a horizontal surface of the substrate; forming a stack layer of alternately arranged sacrificial layer and channel layer on the position maintaining layer formed with the pattern; forming a first trench extending in a first direction in the stack layer, wherein the first trench extends into the substrate; forming a vertical structure connected with the channel layer in the first trench; and forming a second trench extending in a second direction in the stack layer, wherein the second direction intersects the first direction, the second trench exposes the position maintaining layer, and the first trench and the second trench define a stripe-shaped portion of the stack layer extending in the first direction.

According to another aspect of the present disclosure, there is provided an electronic apparatus including the above-mentioned semiconductor device.

According to the embodiments of the present disclosure, the semiconductor device may have a nanosheet branching from the vertical structure, and the nanosheet may have a surface that is not parallel to the horizontal surface of the substrate. With surfaces in different orientations, a performance adjustment and optimization may be achieved. For example, such structure may be used in a channel to optimize a carrier mobility. In a case where the structure is used as the channel, the semiconductor device may be a Multi-Bridge Channel Field Effect Transistor (MBCFET). In addition, the channel may have a zigzag or wavy shape, so that a Multi-Wave Bridge Channel Field Effect Transistor (MWCFET) may be obtained.

BRIEF DESCRIPTION OF THE DRAWINGS

The above and other objectives, features, and advantages of the present disclosure will be clearer through the following descriptions of embodiments of the present disclosure with reference to the accompanying drawings, in which:

FIG. 1 to FIG. 29(b) show schematic diagrams of some stages in a process of manufacturing a semiconductor device according to an embodiment of the present disclosure;

FIG. 30 to FIG. 36(b) show schematic diagrams of some stages in a process of manufacturing a semiconductor device according to another embodiment of the present disclosure, in which FIG. 1 to FIG. 20, FIG. 21(a), FIG. 27(a), FIG. 29(a), FIG. 30 to FIG. 35, FIG. 36(a), and FIG. 36(b) are cross-sectional views taken along line AA';

FIG. 21(b), FIG. 22(c), FIG. 26(c), and FIG. 29(b) are top views, and positions of lines AA', BB', and CC' are shown in the top view of FIG. 21(b);

Throughout the accompanying drawings, the same or similar reference numerals indicate the same or similar components.

DETAILED DESCRIPTION OF EMBODIMENTS

Figure 1:
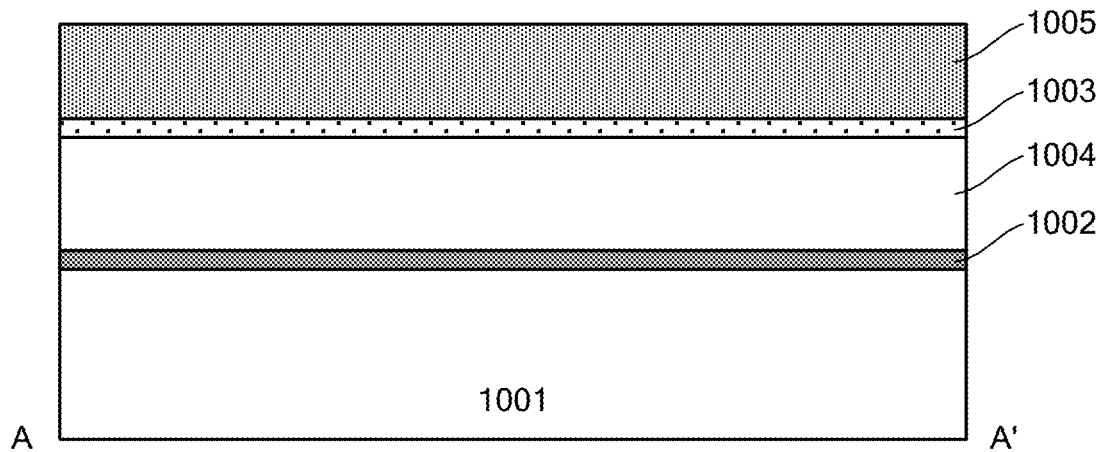

The embodiments of the present disclosure will be described below with reference to the accompanying drawings. However, it should be understood that these descriptions are merely exemplary and are not intended to limit the scope of the present disclosure. In addition, in the following descriptions, descriptions of well-known structures and technologies are omitted to avoid unnecessarily obscuring the concept of the present disclosure.

Various schematic structural diagrams according to the embodiments of the present disclosure are shown in the accompanying drawings. The drawings are not drawn to scale. Some details are enlarged and some details may be omitted for clarity of presentation. Shapes of the various regions, layers as well as the relative size and positional relationship thereof shown in the drawings are only exemplary. In practice, there may be deviations due to manufacturing tolerances or technical limitations, and those skilled in the art may additionally design regions/layers with different shapes, sizes, and relative positions according to actual needs.

In the context of the present disclosure, when a layer/element is referred to as being located "on" another layer/element, the layer/element may be directly on the another layer/element, or there may be an intermediate layer/element therebetween. In addition, if a layer/element is located "on" another layer/element in one orientation, the layer/element may be located "under" the another layer/element when the orientation is reversed.

According to the embodiments of the present disclosure, a semiconductor device is provided. The semiconductor device may have a comb-like structure. The comb-like structure may include a vertical structure extending in a vertical direction relative to a substrate (e.g., a direction substantially perpendicular to a surface of the substrate) and a nanosheet extending from the vertical structure. The nanosheet may be inclined relative to the vertical structure, e.g., extending in a lateral direction (or in a direction deviating from the lateral direction within a certain range) relative to the substrate. The nanosheet may be spaced apart from the substrate. There may be a plurality of such nanosheets spaced apart from each other in the vertical direction. The nanosheet(s) may extend from the vertical structure toward a (same) side of the vertical structure. Thus, the vertical structure and the nanosheet may be comb-like as a whole. According to the embodiments of the present disclosure, the nanosheet may be similar to a nanosheet in a Nanosheet Field Effect Transistor (FET) or Multi-Bridge Channel Field Effect Transistor (MBCFET). In addition, the vertical structure may be similar to a fin in a Fin Field Effect Transistor (FinFET).

According to the embodiments of the present disclosure, at least one nanosheet may include a first portion in a first orientation, and at least one of an upper surface and a lower surface of the first portion may not be parallel to a horizontal surface of the substrate. By adjusting the first orientation, a device performance such as a carrier mobility may be optimized. For example, the horizontal surface of the substrate may be one of $\{100\}$ crystal plane families, and at least one of the upper surface and the lower surface of the first portion may be one of $\{110\}$ crystal plane families, which is beneficial to a hole mobility. Thus, a configuration according to the embodiment of the present disclosure is beneficial to improve the device performance when a p-type device is formed on a (100) substrate. Alternatively, the horizontal surface of the substrate may be one of $\{110\}$ crystal plane families, and at least one of the upper surface and the lower surface of the first portion may be one of $\{100\}$ crystal plane families, which is beneficial to an electron mobility. Thus, a configuration according to the embodiment of the present disclosure is beneficial to improve the device performance when an n-type device is formed on a (110) substrate.

According to the embodiments of the present disclosure, in addition to the first portion, the nanosheet may further include a second portion in a second orientation different from the first orientation. For example, at least one of an upper surface and a lower surface of the second portion may be substantially parallel to the horizontal surface of the substrate. For example, the horizontal surface of the substrate may be one of the $\{100\}$ crystal plane families, and at least one of the upper surface and the lower surface of the second portion may be one of the $\{100\}$ crystal plane families. Alternatively, the horizontal surface of the substrate may be one of the $\{110\}$ crystal plane families, and at least one of the upper surface and the lower surface of the second portion may be one of the $\{110\}$ crystal plane families.

When the nanosheet includes portions in different orientations, the nanosheet may be in a shape of a broken line with one or more inflection points, and the number of inflection points depends on the number of portions in different orientations. Due to the shape of the broken line, within the same occupied area, the nanosheet may have a larger surface area and thus acquire a greater current drive capability. In addition, due to an existence of the portion that is not parallel to the horizontal surface of the substrate along with the vertical structure, a more mechanical stability may be achieved during manufacturing, which may be beneficial to improve a yield rate.

The vertical structure may contain a semiconductor material. In this case, the vertical structure may be used together with the nanosheet as an active structure of the device such as a channel portion. Respective vertical structures of devices adjacent to each other may be defined by the same semiconductor layer. For example, the semiconductor layer may be U-shaped, so that two arms of the U shape may be used as respective vertical structures of two devices. Alternatively, the vertical structure may contain a dielectric material. In this case, devices adjacent to each other may share the same vertical structure.

The nanosheet (and optionally, at least the upper portion of the vertical structure) may be used as the channel portion, and thus the semiconductor device may become a Multi-Bridge Channel Field Effect Transistor (MBCFET). In this case, the semiconductor device may further include source/drain portions located on two opposite sides of the nanosheet in the first direction. The nanosheet(s) (and optionally, at least the upper portion of the vertical structure) are connected between the source/drain portions on the two opposite sides, and a conductive channel may be formed between the source/drain portions. The source/drain portions may contain a material the same as or different from that of the channel portion to, for example, apply a stress to the channel portion so as to enhance the device performance.

According to the embodiments of the present disclosure, a plurality of devices may be formed on the substrate, and different devices may include nanosheets in different orientations. For example, in a case of a Complementary Metal Oxide Semiconductor (CMOS), the orientation of the nanosheets may be respectively optimized for an n-type device and a p-type device so that, for example, at least a portion of a surface of at least a portion of the nanosheets of the n-type device is one of the $\{100\}$ crystal plane families, and at least a portion of a surface of at least a portion of the nanosheets of the p-type device is one of the {110} crystal plane families, thereby respectively optimizing their performances.

The nanosheet may contain a single crystal semiconductor material to improve the device performance. For example, the nanosheet may be formed by an epitaxial growth, so a thickness thereof may be better controlled and may be substantially uniform. Certainly, the source/drain portions may also contain a single crystal semiconductor material.

According to the embodiments of the present disclosure, a spacing between the nanosheets is defined by a sacrificial layer. The sacrificial layer may also be formed by an epitaxial growth, so a thickness thereof may be better controlled and may be substantially uniform. Thus, a spacing between adjacent nanosheets may be substantially uniform.

According to the embodiments of the present disclosure, different first and second devices on the substrate may be formed based on mutually different first and second portions of the same nanosheet or nanosheet stack layer. Thus, the first device and the second device may include similar nanosheets or nanosheet stack layers. For example, the first device and the second device may each have the same number of nanosheets (the number may also be different, for example, one or more nanosheets may be removed for a device in order to adjust the current drive capability). The nanosheets in the first device and the second device at the same level relative to the substrate may be separated from the same epitaxial layer, and thus may have the same thickness and may contain the same material. Nanosheets at adjacent levels in the first device relative to the substrate and nanosheets at corresponding levels in the second device may be separated from two epitaxial layers at the corresponding levels. Therefore, a spacing between these nanosheets may be determined by a sacrificial layer between the two epitaxial layers and thus may be substantially uniform.

The semiconductor device may further include a gate stack intersecting the channel portion. The gate stack may extend in a second direction intersecting (e.g., perpendicular to) the first direction, and extend across the channel portion from one side of the channel portion to the other side of the channel portion. The gate stack may enter a gap between nanosheets of the channel portion and a gap between the lowermost nanosheet and the substrate. Thus, the gate stack may surround each nanosheet and define a channel region therein. In a case where the channel portion includes at least the upper portion of the vertical structure, the gate stack may also overlap with at least the upper portion (e.g., opposite sidewalls and a top surface) of the vertical structure.

A gate spacer may be formed on sidewalls on two opposite sides of the gate stack in the first direction. The gate stack may be spaced apart from the source/drain portions through the gate spacer. Outer sidewalls of the gate spacer facing each source/drain portion may be substantially coplanar in the vertical direction, and may be substantially coplanar with sidewalls of the nanosheets. Inner sidewalls of the gate spacer facing the gate stack may be substantially coplanar in the vertical direction, so that the gate stack may have a substantially uniform gate length. The gate spacer may have a substantially uniform thickness.

Such a semiconductor device may be manufactured, for example, as follows.

For example, a position maintaining layer may be formed on the substrate, the position maintaining layer may be used to define a position of an isolation layer. In order to form a nanosheet having a surface (which is not parallel to the horizontal surface of the substrate) in a first orientation, and a pattern having a surface in the first orientation may be formed on the position maintaining layer. For example, the pattern may be obtained by patterning a surface of the position maintaining layer. On the position maintaining layer on which the pattern is formed, a stack layer of alternately arranged sacrificial layers and channel layers may be formed by, for example, an epitaxial growth. At least one layer may be substantially conformal to the pattern formed on the substrate, and thus at least a portion of at least one of an upper surface and a lower surface of the at least one layer may be in the first orientation.

The stack layer may be patterned into a stripe shape extending in the first direction. For example, a first trench extending in the first direction may be formed in the stack layer, and the first trench may extend into the substrate. A vertical structure connected with the channel layer may be formed in the first trench. For example, the vertical structure may be formed by epitaxially growing a semiconductor layer on a surface of the first trench, or filling the first trench with a dielectric material. The vertical structure may play a role of supporting the nanosheet. Then, a second trench extending in the first direction and spacing apart from the first trench in a second direction intersecting (e.g., perpendicular to) the first direction may be formed in the stack layer. The first trench and the second trench define a stripe-shaped portion of the stack layer extending in the first direction. The second trench may expose the position maintaining layer for a subsequent removal. For example, the position maintaining layer may be removed through the second trench, and the isolation layer may be formed on the substrate.

A sacrificial gate layer extending in the second direction so as to intersect a stripe-shaped portion of the stack layer may be formed on the isolation layer. The stripe-shaped portion of the stack layer may be patterned by using the sacrificial gate layer as a mask, so that the stripe-shaped portion of the stack layer is left below the sacrificial gate layer to form a nanosheet (which may be used as a channel portion). Source/drain portions connected with each nanosheet (and the vertical structure) may be formed by, for example, an epitaxial growth, on two opposite sides of the stack layer in the first direction on the substrate. The sacrificial gate layer and the sacrificial layer in the stack layer may be replaced with a real gate stack by a replacement gate process.

The present disclosure may be presented in various forms, some examples of which will be described below. In the following descriptions, a selection of various materials is involved. In the selection of materials, in addition to a function of the material (for example, a semiconductor material is used for forming an active region, a dielectric material is used for forming an electrical isolation), an etching selectivity is also considered. In the following descriptions, a desired etching selectivity may or may not be indicated. It should be clear to those skilled in the art that when etching a material layer is mentioned below, if it is not mentioned or shown that other layers are also etched, then the etching may be selective, and the material layer may have an etching selectivity relative to other layers exposed to the same etching recipe.

The MBCFET will be described below as an example. However, the present disclosure is not limited to this. For example, the comb-like structure according to the embodiments of the present disclosure may be used in other semiconductor devices.

FIG. 1 to FIG. 29(b) show schematic diagrams of some stages in a process of manufacturing a multi-bridge channel semiconductor device according to an embodiment of the present disclosure.

As shown in FIG. 1, a substrate 1001 is provided. The substrate 1001 may be a substrate in various forms, including but not limited to a bulk semiconductor material substrate such as a bulk Si substrate, a semiconductor-on-insulator (SOI) substrate, a compound semiconductor substrate such as a SiGe substrate, and the like. In the following descriptions, for ease of explanation, a bulk Si substrate is taken as an example for description.

The substrate 1001 may have a substantially flat top surface. Here, the top surface may be referred to as a horizontal surface of the substrate 1001. For example, the substrate 1001 may be a (100) wafer, so that the horizontal surface of the substrate 1001 may be one of {100} crystal plane families.

A position defining layer 1002 and a position maintaining layer 1004 may be sequentially formed on the substrate 1001 by, for example, an epitaxial growth. The position defining layer 1002 may define a bottom position of an isolation layer in a subsequent etching, and a thickness of the position defining layer is, for example, about 5 nm to 20 nm; the position maintaining layer 1004 may define a space occupied by the isolation layer, and a thickness of the position maintaining layer is, for example, about 20 nm to 150 nm. The position maintaining layer 1004 may have a substantially flat top surface parallel to the horizontal surface of the substrate.

Adjacent layers in the substrate 1001, the position defining layer 1002, and the position maintaining layer 1004 may have an etching selectivity relative to each other. For example, the substrate 1001 may be a silicon wafer, the position defining layer 1002 may contain SiGe (an atomic percent of Ge is, for example, about 20% to 50%), and the position maintaining layer 1004 may contain Si. In this example, both the substrate 1001 and the position maintaining layer 1004 contain Si, so that the position defining layer 1002 may define an etch stop position when the position maintaining layer 1004 is selectively etched below. However, the present disclosure is not limited to this. For example, the position defining layer 1002 may also be omitted when the substrate 1001 and the position maintaining layer 1004 contain materials having an etching selectivity relative to each other.

A hard mask layer 1005 may be formed on the position maintaining layer 1004 by, for example, deposition. For example, the hard mask layer 1005 may contain a nitride (e.g., silicon nitride) with a thickness of about 50 nm to 150 nm. Before the hard mask layer 1005 of nitride is deposited, a thin (e.g., with a thickness of about 2 nm to 10 nm) etch stop layer 1003 of an oxide (e.g., silicon oxide) or other materials may also be formed by, for example, deposition.

In order to form a nanosheet surface inclined relative to the horizontal surface of the substrate 1001 on the position maintaining layer 1004, the flat top surface of the position maintaining layer 1004 may be patterned to have an inclined configuration. For example, an etching recipe with an etching selectivity for a certain crystal plane orientation may be used to obtain an inclined surface in the crystal plane orientation.

In order to increase a freedom to pattern the surface of the position maintaining layer 1004, a more general etching solution may be used. In this case, in order to better control an inclination or an orientation of a finally formed inclined surface, a stepped pattern may be formed on the top surface of the position maintaining layer 1004, and then a sharp portion of the stepped pattern may be smoothed to form an inclined surface. The inclination may be controlled by controlling a height of a step and/or a spacing between adjacent steps in the stepped pattern. In general, the higher the height of the step, the steeper the step; the smaller the spacing between adjacent steps, the steeper the step.

The stepped pattern may be formed in various ways. For example, a portion of the surface of the position maintaining layer 1004 may be shielded with a photoresist, and the position maintaining layer 1004 may be etched by using the photoresist as a mask. Then, the photoresist is trimmed, and the position maintaining layer 1004 is etched by using the trimmed photoresist as a mask. The trimming and etching processes may be repeated a plurality of times, so that the stepped pattern may be obtained.

Figure 2:
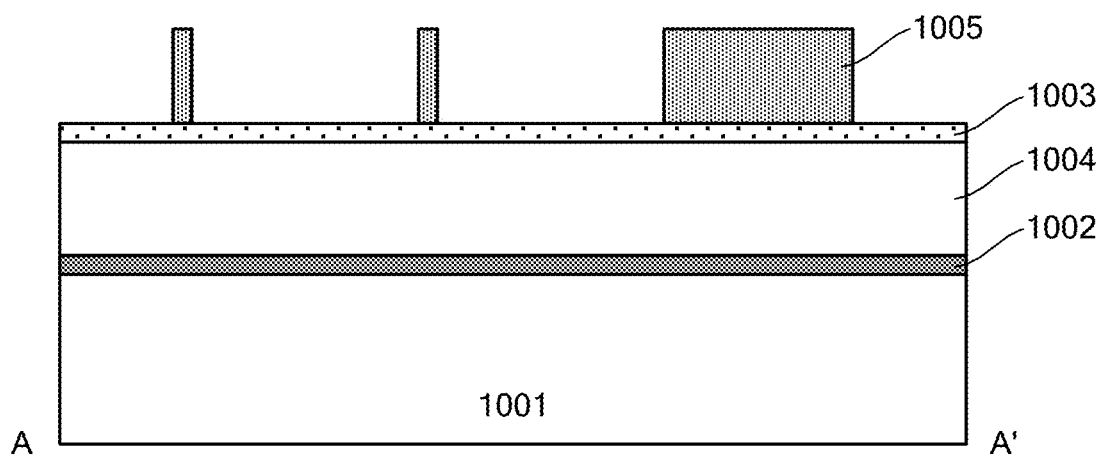

According to the embodiments of the present disclosure, in order to better control the spacing between adjacent steps in the stepped pattern so that the finally acquired inclination may be more precisely controlled, a spacer may be used to facilitate patterning. In order to form the spacer, a mandrel pattern may be formed on the position maintaining layer 1004 at a position to form the stepped pattern. For example, as shown in FIG. 2, the hard mask layer 1005 may be selectively etched, such as Reactive Ion Etching (RIE), by using a photoresist (not shown), so as to form a mandrel pattern 1005. Here, the RIE may be in a vertical direction (e.g., a direction substantially perpendicular to the surface of the substrate 1001), so that the mandrel pattern 1005 may have a vertical sidewall. The RIE may be stopped at the etch stop layer 1003.

Figure 3:
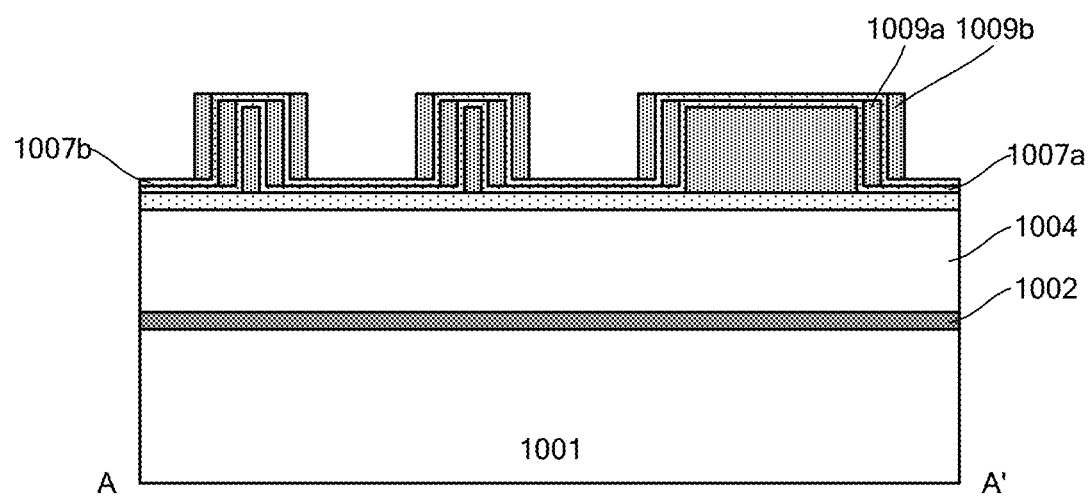

A spacer may be formed on the sidewall of the mandrel pattern 1005. For example, as shown in FIG. 3, spacers 1009a, 1009b may be formed. A formation of the spacer may include substantially conformally forming a spacer material layer on the position maintaining layer 1004 on which the mandrel pattern 1005 is formed by, for example, depositing, and performing an anisotropic etching, such as RIE in the vertical direction, on the formed spacer material layer. Here, thicknesses (measured in a horizontal direction in the drawing) of the spacers 1009a, 1009b or a thickness of the deposited spacer material layer may be determined at least in part by an inclination to be achieved. As an example, the thickness of the deposited spacer material layer may be about 3 nm to 20 nm. In addition, in this example, it is shown that two spacers 1009a and 1009b are formed on each of the opposite sidewalls of the mandrel pattern 1005. However, the present disclosure is not limited to this. There may be more or less spacers. Here, the number of the spacers 1009a, 1009b may be determined according to the number of steps to be achieved (depending at least in part on a range of the inclined surface to be achieved).

According to the embodiments of the present disclosure, in order to simplify the process, the spacers 1009a, 1009b may contain the same material, and may contain the same material as that of the mandrel pattern 1005, such as a nitride. In order to allow to etch the spacers one by one in a subsequent process, etch stop layers 1007a, 1007b may be provided between the spacers and between the spacer and the mandrel pattern. For example, the etch stop layers 1007a, 1007b may be thin layers (e.g., with a thickness of about 1 nm to 3 nm), such as oxide layers, having an etching selectivity relative to the spacer and the mandrel pattern. For example, the etch stop layers 1007a, 1007b may be respectively deposited before the spacer material layers are deposited.

Next, the position maintaining layer 1004 may be etched by using the thus formed mandrel pattern 1005 and the spacers 1009a, 1009b to form the stepped pattern. The process is similar to the above-mentioned processes of repeatedly trimming the photoresist and etching the substrate, except that in each trimming process, a pair of spacers on the opposite sidewalls of the mandrel pattern may be controllably removed.

Figure 4:
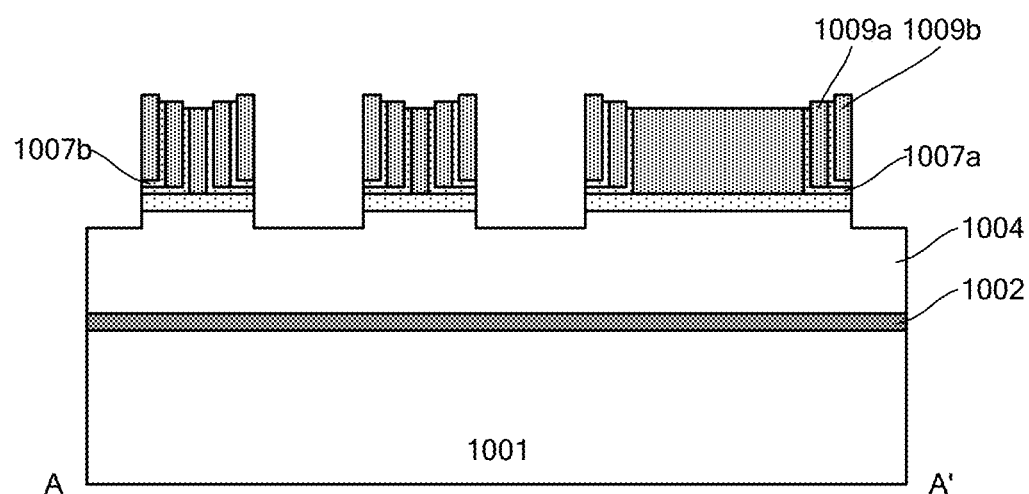
Figure 5:
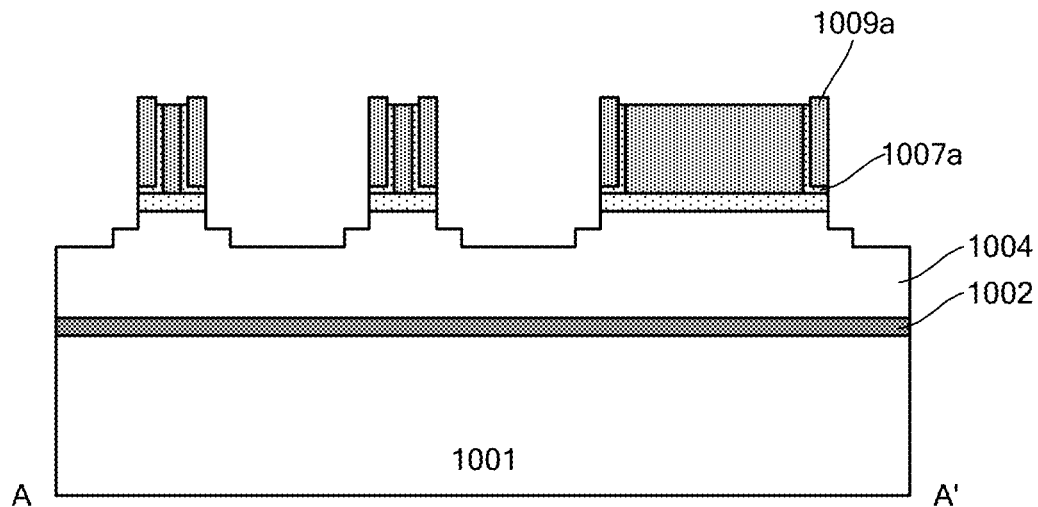

Specifically, as shown in FIG. 4, the etch stop layers 1007b, 1007a, and 1003 may be selectively etched sequentially by, for example, RIE in the vertical direction, so as to expose the surface of the position maintaining layer 1004. Then, the exposed portion of the position maintaining layer 1004 may be selectively etched to a certain depth by, for example, RIE in the vertical direction. An etch depth (referred to herein to as a "first depth") may be determined according to the height of the step in the stepped pattern to be formed (depending at least in part on the inclination to be achieved). Next, as shown in FIG. 5, the spacer 1009b may be selectively etched isotropically so as to be removed. The etching of the spacer 1009b may be stopped at the etch stop layer 1007b. The etch stop layers 1007b, 1007a and the etch stop layer 1003 located below exposed by a removal of the spacer 1009b may be selectively etched by, such as RIE, so as to further expose the surface of the position maintaining layer 1004. After that, the exposed portion of the position maintaining layer 1004 may be selectively etched to a certain depth (herein referred to as a "second depth", which may be the same as the first depth) through the process described in combination with FIG. 4. Thus, a current etch depth of the exposed position maintaining layer portion in FIG. 4 may be a sum of the first depth plus the second depth, and a current etch depth of the position maintaining layer portion in FIG. 5 newly exposed by the removal of the spacer 1009b may be the second depth, so that the stepped pattern may be formed. In a similar manner, the spacer 1009a may be further removed and etched again, so that the number of steps may be increased.

Figure 6:
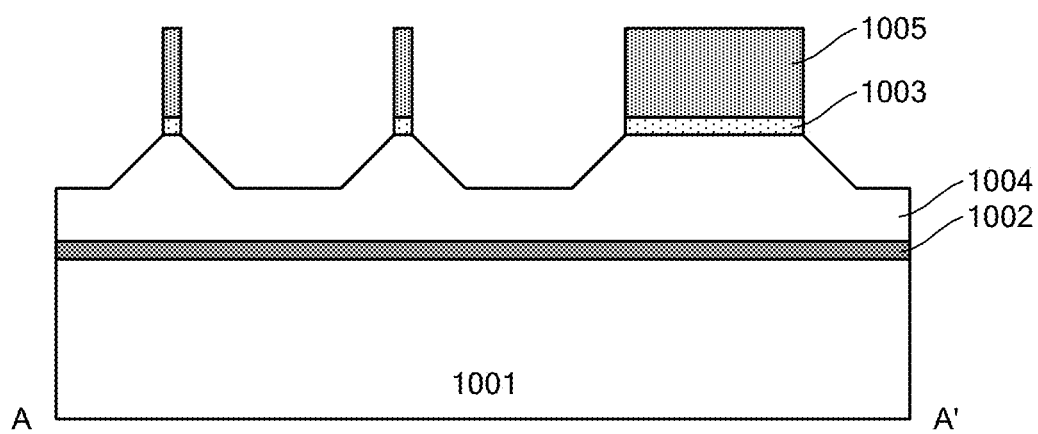

Thus, the stepped pattern is formed on the surface of the position maintaining layer 1004. The stepped pattern thus formed may be smoothed to obtain an inclined surface. For example, as shown in FIG. 6, an ion etching and/or bombardment may be performed on the surface of the position maintaining layer 1004 to smooth a sharp portion of the stepped pattern, so that an inclined surface may be obtained. The ion etching and/or bombardment may be performed in combination with the RIE process performed on the position maintaining layer 1004 after the innermost spacer 1009a is removed. For example, during the RIE performed on the position maintaining layer 1004, an energy of plasmas may be adjusted to achieve a smooth inclined surface (e.g., due to a scattering of Ar or N atoms/ions). The inclination may be controlled by controlling etch depths, such as the first depth and the second depth, as described in connection with FIG. 4 and FIG. 5, so as to optimize an area occupied by the device and the device performance (e.g., a carrier mobility, on-current, or the like). As an example, the inclined surface may be one of {110} crystal plane families.

After that, the mandrel pattern 1005 and the remaining etch stop layers may be removed by a selective etching. In order to reduce an impact on the surface of the position maintaining layer 1004, a wet etching may be used. For example, the mandrel pattern 1005 of nitride may be etched by using a hot phosphoric acid solution, and the etch stop layers of oxide may be etched by using hydrochloric acid or a buffered oxide etchant (BOE).

The device may be manufactured on the position maintaining layer 1004 having an inclined configuration on a surface thereof.

Figure 7:
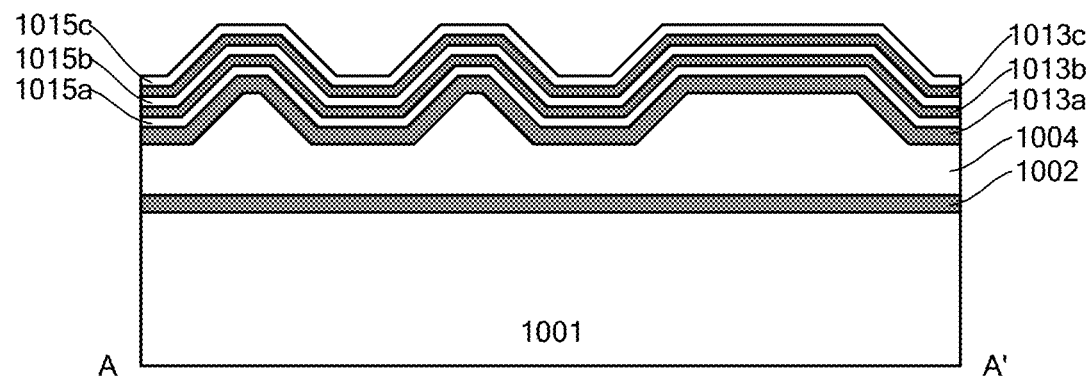

For example, as shown in FIG. 7, an alternating stack layer of sacrificial layers 1013a, 1013b, 1013c and channel layers 1015a, 1015b, 1015c may be formed on the surface of the position maintaining layer 1004 by, for example, an epitaxial growth. The channel layers 1015a, 1015b, 1015c may then form nanosheets of a channel portion, with a thickness of, for example, about 3 nm to 15 nm. When growing the channel layers 1015a, 1015b, 1015c, an in-situ doping may be performed to adjust a device threshold. The sacrificial layers 1013a, 1013b, 1013c may define a gap between the lowermost nanosheet and the substrate 1001 and a gap between adjacent nanosheets, with a thickness of, for example, about 5 nm to 20 nm. The lowermost sacrificial layer 1013a may be relatively thick, for example, about 2 nm to 5 nm thicker than the other sacrificial layers 1013b, 1013c. The number of the sacrificial layers and the channel layers in the alternating stack layer may be changed according to a device design, for example, the number may be more or less.

The position maintaining layer 1004 and adjacent layers in the above-mentioned layers formed thereon may have an etching selectivity relative to each other. The sacrificial layer 1013a may contain a material similar to or the same as that of the position defining layer 1002, and thus may have a similar or same etching selectivity for the same etching recipe subsequently. For example, the sacrificial layers 1013a, 1013b, 1013c may contain SiGe with an atomic percentage of Ge of about 20% to 50%, which is substantially the same as or close to that in the position defining layer 1002. The channel layers 1015a, 1015b, 1015c may contain Si.

The channel layers 1015a, 1015b, 1015c may have shapes extending along the surface of the position maintaining layer 1004 and thus have surfaces that are inclined or not parallel relative to the horizontal surface of the substrate 1001. For example, the channel layers 1015a, 1015b, 1015c and the sacrificial layers 1013a, 1013b, 1013c may each be formed substantially conformally on the surface of the position maintaining layer 1004 and may have a substantially uniform thickness. In this case, the inclined surfaces of the channel layers 1015a, 1015b, 1015c may be consistent with the inclined configuration of the position maintaining layer 1004, and thus be, for example, one of the {110} crystal plane families.

The isolation layer may be formed by replacing the position maintaining layer 1004 with a dielectric material. During the replacement, there is a process in which the stack is suspended relative to the substrate. In order to maintain the stack layer, a vertical structure connected to the substrate may be formed to support the stack layer. For the same device region, a vertical structure may be formed on one side, and the other side may be exposed for performing the replacement process. Respective vertical structures of adjacent devices may be located therebetween and may be formed together.

Figure 8:
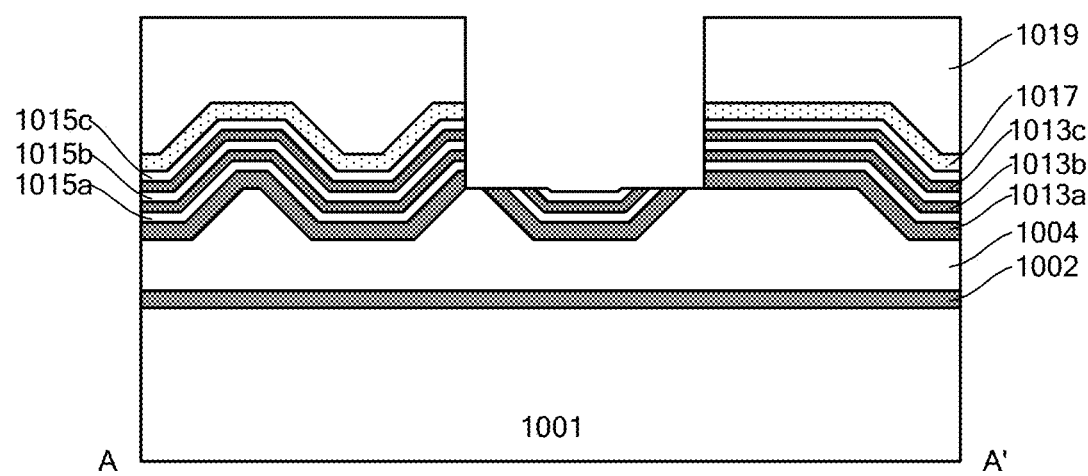

For example, as shown in FIG. 8, a photoresist 1019 may be formed on the stack layer and patterned to expose a region between some adjacent devices. Before the photoresist 1019 is formed, an oxide layer 1017 (with a thickness of, for example, about 5 nm to 20 nm) may be formed on the top surface of the stack layer to protect a surface of the stack layer, for example, prevent the surface from being damaged by processes such as oxidation and cleaning when removing the photoresist 1019. Next, the oxide layer 1017 and each layer in the stack layer are selectively etched sequentially, such as RIE, by using the photoresist 1019 as a mask, so as to form a trench (which may be referred to as a first trench) penetrating the stack layer. In this example, a formation of one trench is taken as an example for description. However, the present disclosure is not limited to this. For example, more or fewer trenches may be formed. A vertical structure may be formed in the first trench to support stack layers on two sides of the first trench.

In this example, considering that the subsequently formed vertical structure contains the same material (in this example, Si) as that of the position maintaining layer 1004, in order to avoid affecting the vertical structure during a process of replacing the position maintaining layer 1004 with the isolation layer, an etch stop layer (see 1023 in FIG. 12) may be formed in the trench first, and then the vertical structure is formed. On the other hand, the etch stop layer may not exist on a sidewall of the channel layer considering that the vertical structure and the channel layer may be connected with each other to form the channel portion of the device together. That is, the etch stop layer may be formed at a lower portion of the trench without covering the sidewall of the stack layer or the channel layer in the stack layer (see FIG. 12).

To this end, the trench may be formed in stages.

Figure 9:
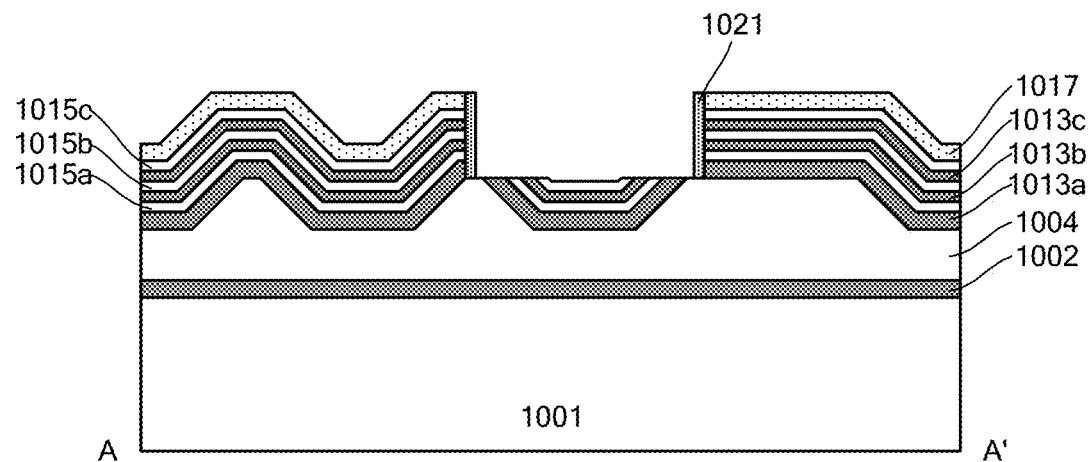

For example, in the process described in FIG. 8, the etch depth may be controlled, so that the sidewall of each layer in the stack layer may be exposed (a certain process margin is considered at the same time), but the etching does not proceed too much into the position maintaining layer 1004. After that, the photoresist 1019 may be removed. The etch depth defines an upper portion of the trench where an etch stop layer does not need to be formed. A protective layer 1021 may be formed on a sidewall of the upper portion of the thus defined trench, as shown in FIG. 9, so as to prevent the sidewall from being affected in the subsequent processing. The protective layer 1021 may be formed through a spacer process, and may contain a nitride with a thickness of, for example, about 1 nm to 5 nm.

Figure 10:
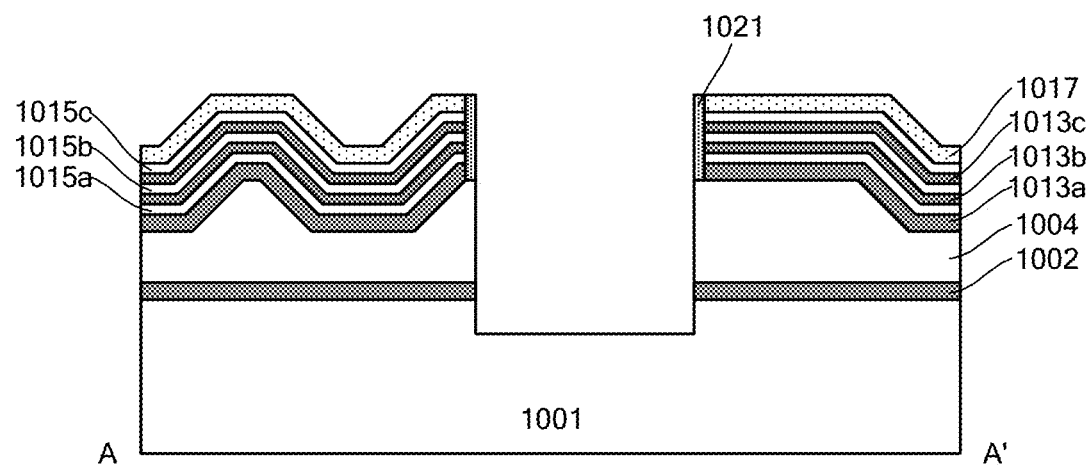

Then, as shown in FIG. 10, the trench may be deepened by further etching such as RIE. Here, the etch depth may be controlled to extend the trench into the substrate 1001, so that the subsequently formed vertical structure may be connected to the substrate 1001 and thus may be used as a support structure to support the stack layer especially during the process of removing the position maintaining layer 1004. The etch depth here defines a lower portion of the trench where an etch stop layer may be formed.

Figure 11:
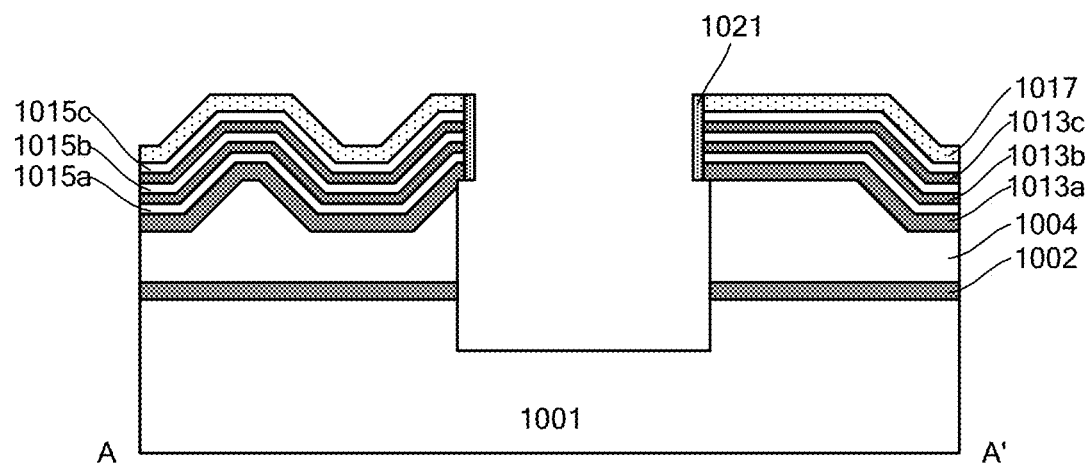

In order to form the etch stop layer only on the lower portion of the trench and not on the upper portion of the trench, as shown in FIG. 11, a sidewall the lower portion of the trench may be recessed relative to the sidewall of the upper portion of the trench by etching back with an etch back depth of, for example, about 5 nm to 10 nm. Here, the trench that is etched back should not expose the channel layer (especially the lowermost channel layer 1015*a*) in the stack layer, that is, the lowermost sacrificial layer 1013*a* should not be etched off, so that the lowermost sacrificial layer 1013*a* may effectively function as an etch stop during the process of removing the position maintaining layer 1004. In this way, a desired first trench may finally be obtained.

Figure 12:
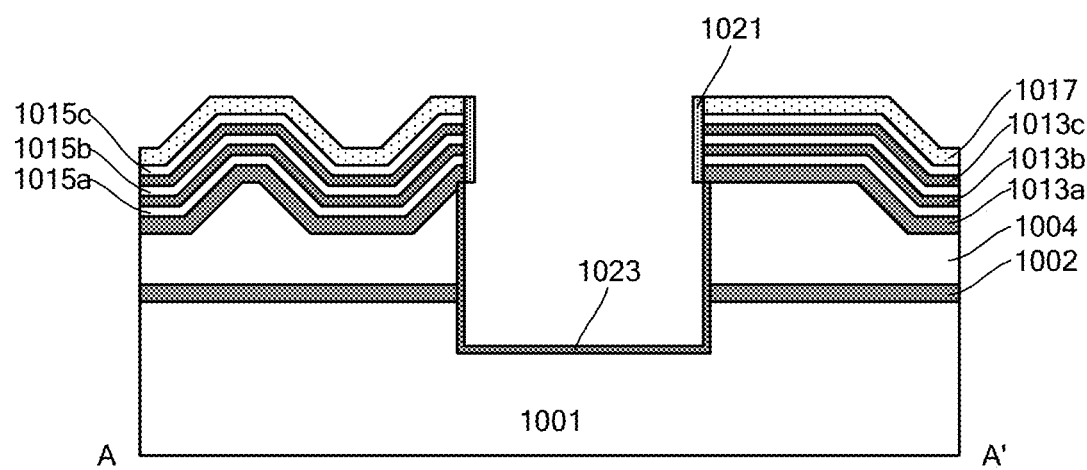

An etch stop layer may be formed in the recess. For example, as shown in FIG. 12, an etch stop layer 1023 may be formed on a surface of the lower portion of the trench by a selective epitaxy. The selective epitaxial growth may not occur on a surface of the protective layer 1021. The grown etch stop layer 1023 may be controlled to have a thin thickness of, for example, about 2 nm to 5 nm, so that the grown etch stop layer 1023 may not extend to the protective layer 1021. The etch stop layer 1023 may contain a material similar to or the same as that of the sacrificial layer 1013*a* and the position defining layer 1002, and thus may subsequently have a similar to or same etch selectivity for the same etching recipe. For example, the etch stop layer 1023 may contain SiGe with an atomic percentage of Ge of about 20% to 50%, which is substantially the same as or close to that in the sacrificial layer 1013*a* and the position defining layer 1002.

It may be shown that, on two sides of the first trench, the position maintaining layer 1004 is covered by the position defining layer 1002 on a lower side, and covered by the sacrificial layer 1013*a* on an upper side. One side in a horizontal direction of the position maintaining layer 1014 is covered by the etch stop layer 1023, and the other side in the horizontal direction may be subsequently exposed (so as to be removed).

After that, the protective layer 1021 may be removed by a selective etching. In order to reduce a damage to the stack layer, especially the channel layer therein, a wet etching, such as a hot phosphoric acid solution, may be used. Thus, the sidewall of each layer in the stack layer may be exposed in the upper portion of the trench.

Figure 13:
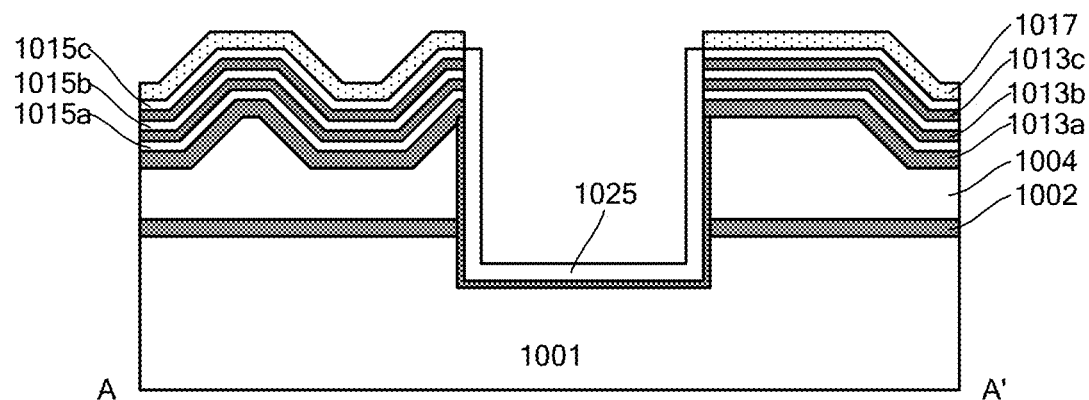

As shown in FIG. 13, a semiconductor layer 1025 may be formed by, for example, a selective epitaxial growth, in the trench with the etch stop layer formed on a lower surface of the trench. The semiconductor layer 1025 extends along a surface of the trench so as to present a U shape, two opposite arms of the U-shape may be respectively used as vertical structures of the corresponding device. In this example, the semiconductor layer 1025 may be connected with each channel layer. According to the embodiment, the semiconductor layer 1025 (especially an upper portion thereof) may also be used (together with the channel layer) as the channel portion (similar to a fin) of the device, and thus may contain the same material as that of the channel layer such as Si, with a thickness of, for example, about 3 nm to 10 nm.

In addition, in order to suppress a leakage current, a punch-through stopper (PTS) may be formed in a lower portion (e.g., a portion below a top surface of a subsequently formed isolation layer, that is, a portion below a portion of the semiconductor layer 1025 serving as the channel portion) of the semiconductor layer 1025 (see 1037*a*, 1037*b* shown in FIG. 18).

Figure 14:
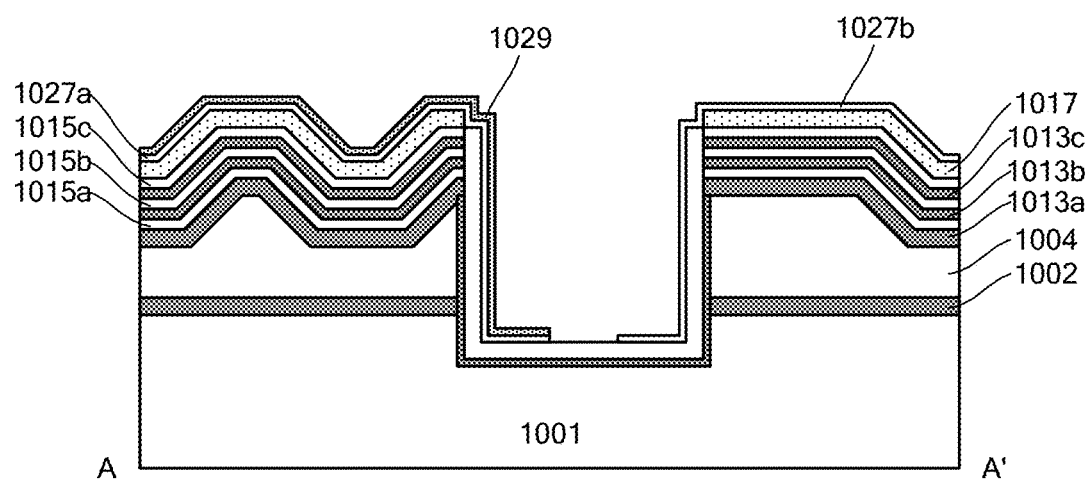

The PTS may be achieved by doping the lower portion of the semiconductor layer 1025 with a conductivity type opposite to that of the device. The doping may be achieved by, for example, a solid-phase doping. For example, as shown in FIG. 14, a first dopant source layer 1027*a* may be formed on the structure shown in FIG. 13 by, for example, deposition. For example, the first dopant source layer 1027*a* may be an oxide layer containing an n-type dopant such as As or P with a concentration of about 0.1% to 5%, and a thickness of the first dopant source layer is about 1 nm to 3 nm. In order to avoid a cross-contamination, a barrier layer 1029 may be formed on the first dopant source layer 1027*a* by, for example, deposition. For example, the barrier layer 1029 may be a nitride or an oxynitride with a thickness of about 1 nm to 3 nm. The first dopant source layer 1027*a* and the barrier layer 1029 located above may be patterned by, for example, photolithography so as to be left on the semiconductor layer 1025 (e.g., a left portion in the drawing) for a p-type device. Similarly, a second dopant source layer 1027*b* may be formed. For example, the second dopant source layer 1027*b* may be an oxide layer containing a p-type dopant such as B with a concentration of about 0.1% to 5%, and a thickness of the second dopant source layer is about 1 nm to 3 nm. The second dopant source layer 1027b may be patterned to be left on the semiconductor layer 1025 (e.g., a right portion in the drawing) for an n-type device region.

Here, a simultaneous formation of a p-type device and an n-type device (and a CMOS configuration may thus be formed) is taken as an example for description. However, the present disclosure is not limited to this. When a device of a separate conductivity type is formed, it is not necessary to separately form dopant source layers having dopants of different conductivity types.

Currently, the first dopant source layer 1027a and the second dopant source layer 1027b respectively cover the entire vertical portion of the semiconductor layer 1025. However, only a lower portion of the vertical portion of the semiconductor layer 1025 is required to be doped to form the PTS. The first dopant source layer 1027a and the second dopant source layer 1027b located at the upper portion of the vertical portion of the semiconductor layer 1025 may be removed. This may be performed in combination with the formation of the isolation layer, since the upper portion and the lower portion are defined based on the top surface of the isolation layer.

Figure 15:
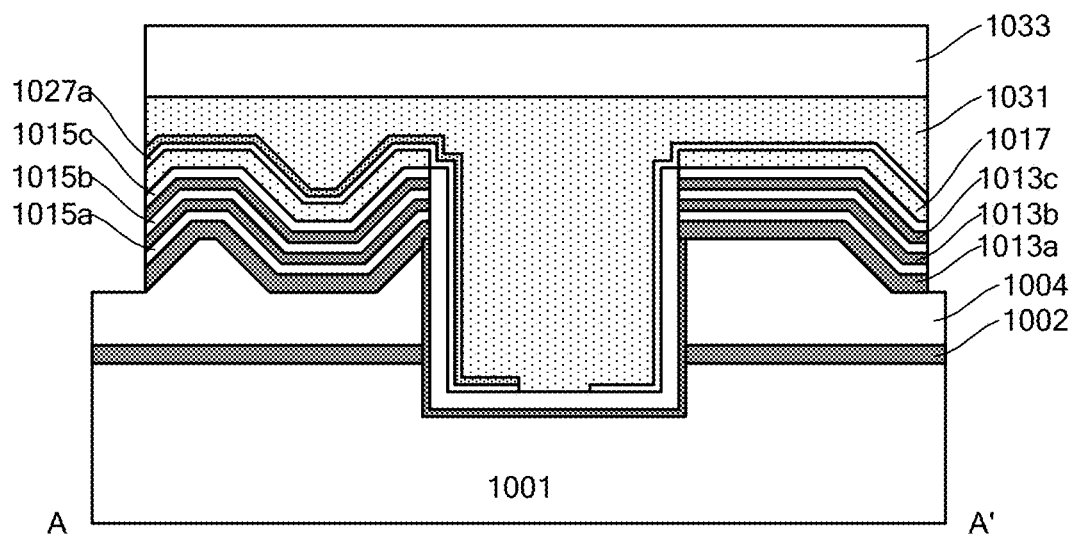

As shown in FIG. 15, a dielectric material 1031, such as an oxide, may be formed on the substrate 1001 by, for example, deposition. The dielectric material 1031 may be used to fill the trench and may be used to cover the stack layer, the first dopant source layer 1027a and the second dopant source layer 1027b. A planarization process such as CMP may be performed on the deposited dielectric material 1031.

A processing channel to the position maintaining layer 1004 may be formed. For example, a photoresist 1033 may be formed on the dielectric material 1031 and patterned to expose a region between some adjacent device areas. Each layer in the stack layer (and each material layer above the stack layer) is sequentially selectively etched, such as RIE, by using the photoresist 1033 as a mask, so as to form a second trench. Here, the RIE may proceed into the position maintaining layer 1004 so as to access the position maintaining layer 1004 through the second trench, but the RIE does not reach the position defining layer 1002 (which may avoid that the position maintaining layer 1004 may not be replaced due to being completely shielded by the protective layer in a case of forming a protective layer below). After that, the photoresist 1033 may be removed.

Figure 16:
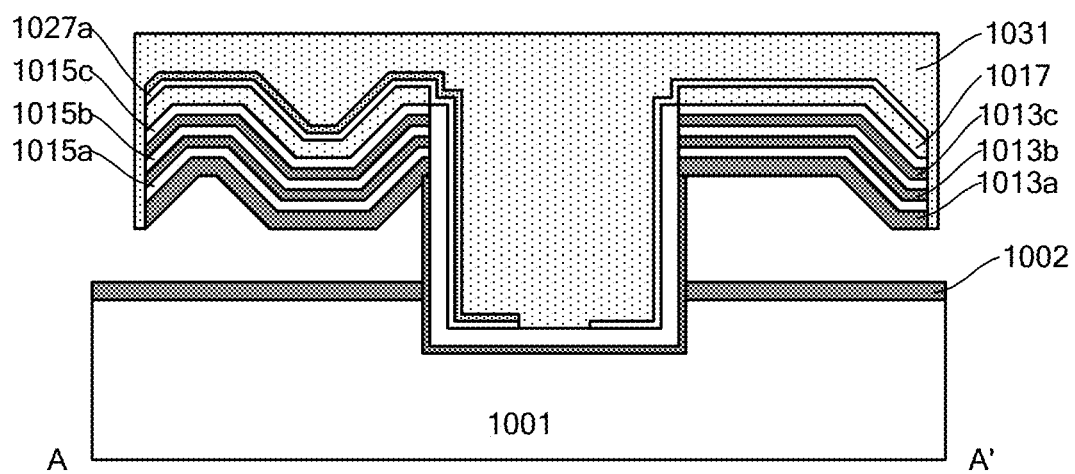

Next, the position maintaining layer 1004 may be replaced with an insulator. In order to protect the stack layer, especially the channel layer therein (especially in this example, both the channel layer and the position maintaining layer 1004 contain Si) during the removal of the position maintaining layer 1004, a protective layer may be formed on the sidewall of the stack layer. For example, as shown in FIG. 16, a protective layer may be formed on the exposed sidewall of the stack layer through a spacer formation process. In this example, the protective layer may contain an oxide, and may thus be shown integrally with the dielectric material 1031, which is also an oxide, as 1031.

The position maintaining layer 1004 may be removed by a selective etching. On one hand, the vertical structure (in combination with the dielectric material 1031) may be used to suspend the stack layer relative to the substrate 1001; on the other hand, the second trench may be used to form a processing channel for etching the position maintaining layer 1004 below the stack layer. For example, the position maintaining layer 1004 (Si in this example) may be selectively etched relative to the position defining layer 1002, as well as the sacrificial layer 1013a and the etch stop layer 1023 (SiGe in this example) by using a TMAH solution.

Figure 17:
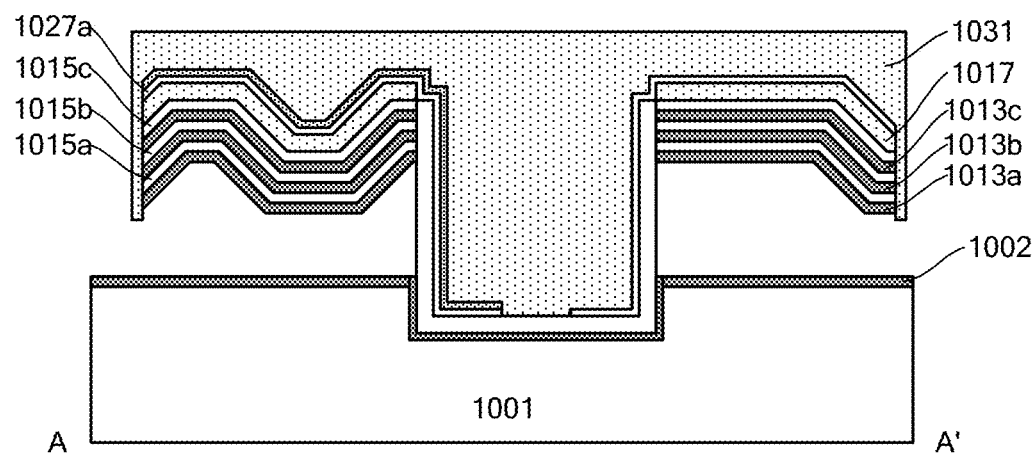

After that, an isolation layer may be formed by filling with a dielectric. In this example, the sacrificial layer will be replaced with a gate stack in a subsequent replacement gate process, and the etch stop layer 1023 containing the same material as that of the sacrificial layer may also be replaced with the gate stack. This may result in an overlap of the gate stack with the lower portion of the vertical portion of the semiconductor layer 1025, which is undesirable. To this end, the etch stop layer 1023 exposed by the removal of the position maintaining layer 1004 may be removed. For example, as shown in FIG. 17, the etch stop layer 1023 (SiGe in this example) may be selectively etched relative to the semiconductor layer 1025 (Si in this example) to expose a sidewall of the semiconductor layer 1025. The lowermost sacrificial layer 1013a (also Si in this example) may also be etched. However, due to a relatively thick thickness of the lowermost sacrificial layer 1013a, an amount of etching may be controlled so that the lowermost sacrificial layer 1013 may still continuously cover an entire lower surface of the channel layer 1015a.

Figure 18:
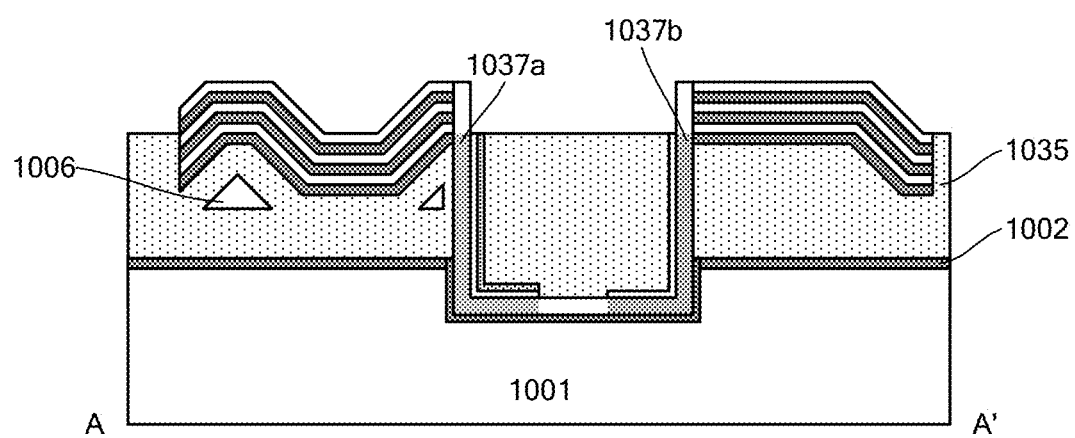

As shown in FIG. 18, a dielectric material may be filled below the stack layer through the second trench to form the isolation layer. The filling may be performed by deposition such as a Chemical Vapor Deposition (CVD), an Atomic Layer Deposition (ALD), and the like. Depending on a size of a space below the stack layer and a filling performance of the deposition process, the space below the stack layer may not be completely filled with the dielectric material, and an air gap 1006 may exist. In order to improve the filling performance, a method of repeating deposition and etching may be used. In addition, the second trench may also be filled with a dielectric material to form an isolation portion between devices. The filled dielectric material may contain an oxide. The dielectric material may be etched back to form an isolation layer 1035. A top surface of the isolation layer 1035 may be close to a position where the lowermost sacrificial layer 1013a is connected with the semiconductor layer 1025 (especially a bottom surface of the lowermost sacrificial layer 1013a at the position) so as to achieve a good control of a gate on a fin. It may be shown that, on one hand, the isolation layer 1035 is disposed between adjacent devices to form an electrical isolation, such as Shallow Trench Isolation (STI), between adjacent devices; on the other hand, the isolation layer 1035 is disposed below the channel portion to suppress a leakage between a source and a drain in the same device.

The barrier layer 1029 and portions of the dopant source layers 1027a, 1027b exposed by the isolation layer 1035 may be selectively etched, such as RIE, so that they may be left below the top surface of the isolation layer 1035. Dopants in the dopant source layers 1027a, 1027b may be driven into the semiconductor layer 1025 by, for example, an annealing process, and PTSs 1037a, 1037b may be formed in the semiconductor layer 1025. Due to the above-mentioned processes, the dopant source layers 1027a, 1027b are left below the top surface of the isolation layer 1035, so that the formed PTSs 1037a, 1037b may not substantially exceed the top surface of the isolation layer 1035. A portion of the semiconductor layer 1025 located above the top surface of the isolation layer 1035 may be used as a fin.

Figure 19:
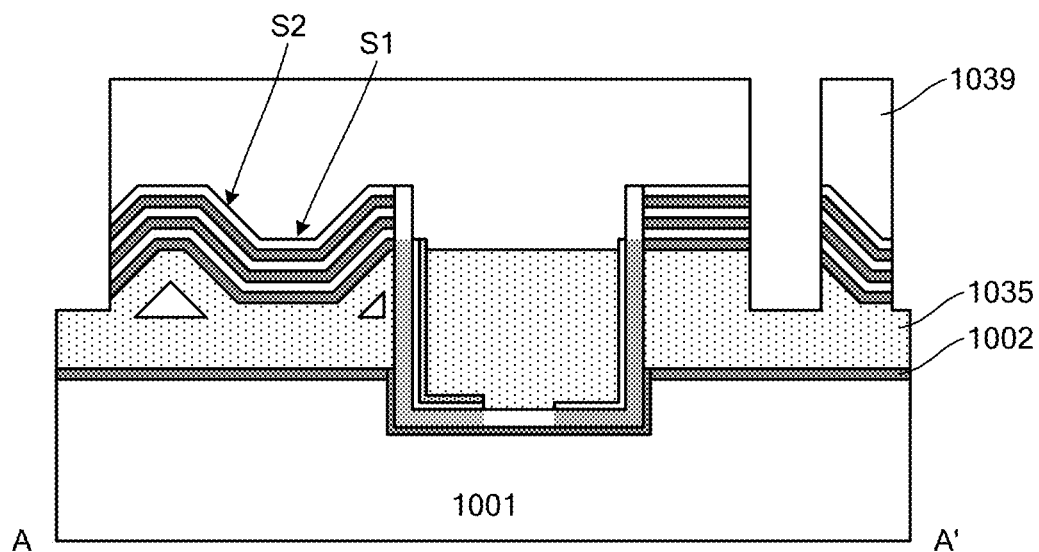

With the above-mentioned formed first and second trenches (and the isolation layer therein), the stack layer has been separated between adjacent devices on the two opposite sides of the trenches. There may be some stack layers between adjacent devices that have not been separated (e.g., the stack layer on a right side in FIG. 18 may be separated into portions for two devices). The stack layer may be separated according to a device layout design. For example, as shown in FIG. 19, a photoresist 1039 may be formed on the stack layer and the isolation layer and patterned to expose a region between adjacent devices that have not been separated. In addition, the photoresist 1039 may also expose a position of the second trench, so that the top surface of the isolation layer 1035 in the second trench may be lowered to expose an entire side surface of the stack layer. A gate stack formed subsequently may surround all the channel layers. Before the photoresist 1017 is formed, a thin oxide layer (not shown) may be formed on the top surface of the stack layer to protect the surface of the stack layer. Next, the stack layer may be selectively etched, such as RIE, by using the photoresist 1039 as a mask, so as to separate the stack layer between different device regions. Here, the RIE may proceed into the isolation layer 1035 so as to fully expose the sidewall of the stack layer, thereby forming a third trench. The first trench, the second trench, and the third trench may all have stripe shapes extending in the first direction (a direction entering a paper surface in the drawing), so that the stack layer may be divided into stripe shapes extending in the first direction for each device. After that, the photoresist 1039 may be removed.

As shown in FIG. 19, three device regions are defined. In the two device regions on the left side, a vertical structure is formed, so that a comb-like structure is obtained; in the rightmost device region, no vertical structure is formed, so that a nanosheet stack is obtained. In addition, in the leftmost device region, the nanosheet may have a surface S1 parallel to the horizontal surface of the substrate 1001 and a surface S2 not parallel to the horizontal surface of the substrate 1001, so that the nanosheet is in a shape of a broken line. In the rightmost device region, the nanosheet may also have a surface parallel to the horizontal surface of the substrate 1001 and a surface not parallel to the horizontal surface of the substrate 1001, so that the nanosheet is in a shape of a broken line. It should be noted that, according to a pattern of the photoresist 1039, in the device region, some of the channel layers may have a shape of an oblique straight line that is not parallel to the horizontal surface of the substrate 1001 rather than the shape of a broken line. In addition, the shape of the broken line is not limited to have a plurality of inflection points as shown in the drawing, but may have a single inflection point. In the middle device region, the channel portion has a surface parallel to the horizontal surface of the substrate 1001.

According to the embodiments of the present disclosure, a combination of a device with a vertical structure and a device without a vertical structure may be formed on the substrate through arrangements of the first trench, the second trench, and the third trench.

As described above, in a case where the substrate 1001 is a (100) wafer, the surface parallel to the horizontal surface of the substrate may be one of the {100} crystal plane families, and the surface not parallel to the horizontal surface of the substrate may be one of the {110} crystal plane families. Alternatively, in a case where the substrate 1001 is a (110) wafer, the surface parallel to the horizontal surface of the substrate may be one of the {110} crystal plane families, and the surface not parallel to the horizontal surface of the substrate may be one of the {100} crystal plane families.

The {100} crystal plane family is beneficial to a mobility of electrons. Therefore, a channel portion whose surface is mainly of the {100} crystal plane families (e.g., a middle region in FIG. 19 in a case of the (100) wafer) may be used to manufacture an n-type device. In addition, the {110} crystal plane family is beneficial to a mobility of holes. Therefore, a channel portion whose surface is mainly of the {110} crystal plane families (e.g., the rightmost region in FIG. 19 in a case of the (100) wafer) may be used to manufacture a p-type device. The leftmost region in FIG. 19 has surfaces of both the {100} and {110} crystal plane families, thus may be used to manufacture the p-type device or the n-type device (p-type device in this example).

Figure 20:
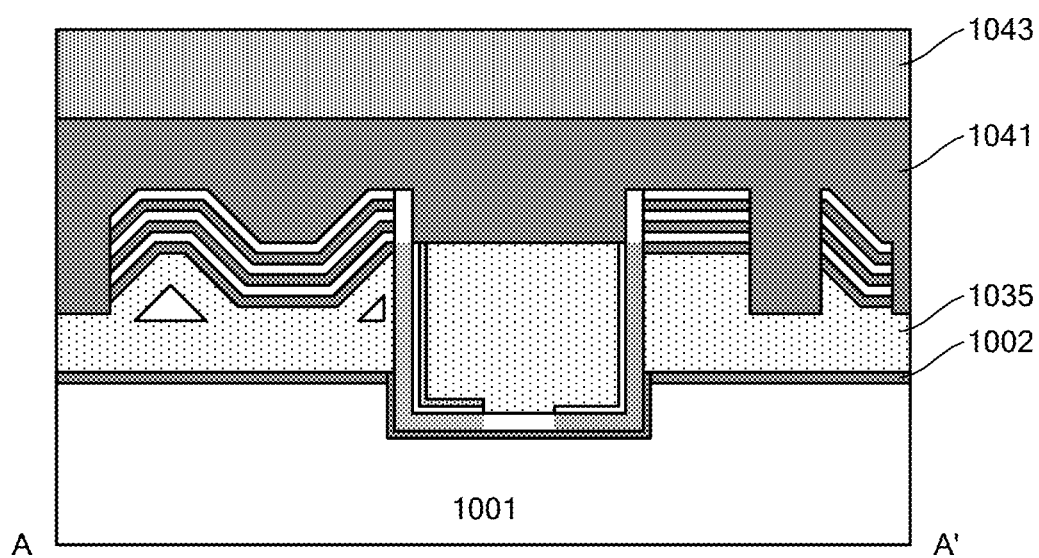

As shown in FIG. 20, a sacrificial gate layer 1041 may be formed on the isolation layer 1035. The sacrificial gate layer 1041 may contain a material similar to or the same as that of the sacrificial layers 1013a, 1013b, 1013c, so that the sacrificial gate layer 1041 may be etched by the same etching recipe later. For example, the sacrificial gate layer 1041 may contain SiGe with an atomic percentage of Ge of about 20% to 50%, which is substantially the same as or close to that in the sacrificial layers 1013a, 1013b, 1013c. The sacrificial gate layer 1041 may be formed by deposition and then planarization such as CMP. A hard mask layer 1043 may be formed on the sacrificial gate layer 1041 by, for example, deposition, so as to facilitate a subsequent patterning of the sacrificial gate layer 1041. For example, the hard mask layer 1043 may contain a nitride.

Figure 21A:
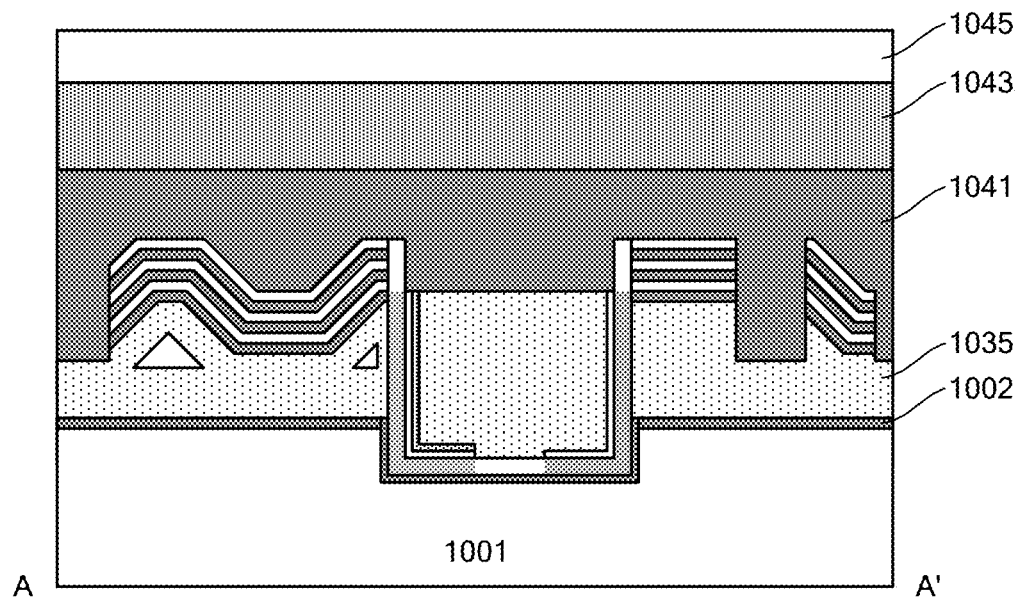
Figure 21B:
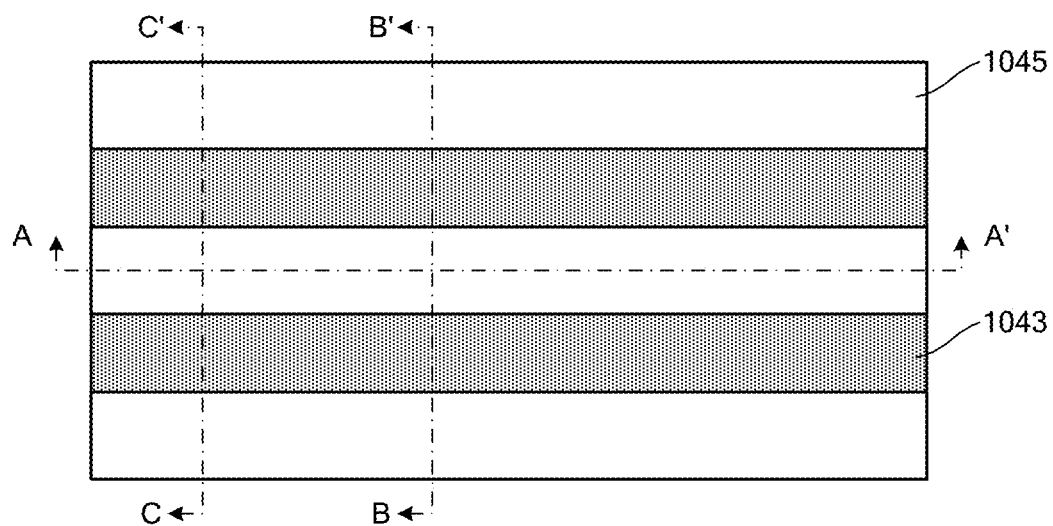
Figure 22A:
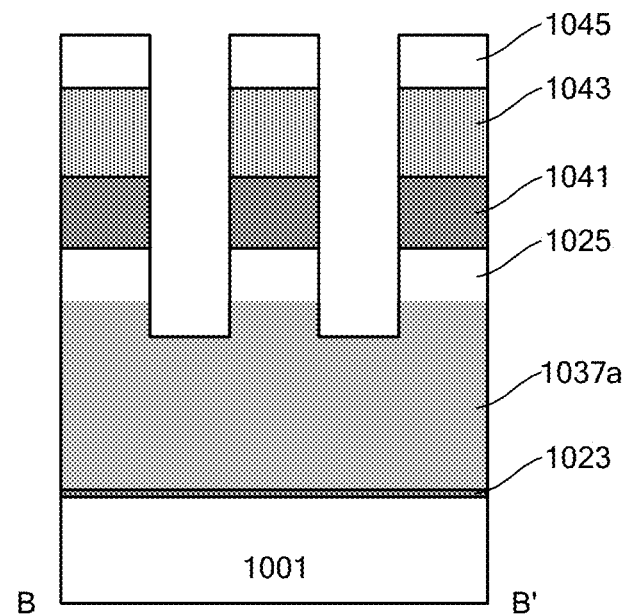
FIG. 22(a), FIG. 23(a), FIG. 24(a), FIG. 25(a), FIG. 26(a), and FIG. 27(b) are cross-sectional views taken along line BB'.
Figure 22B:
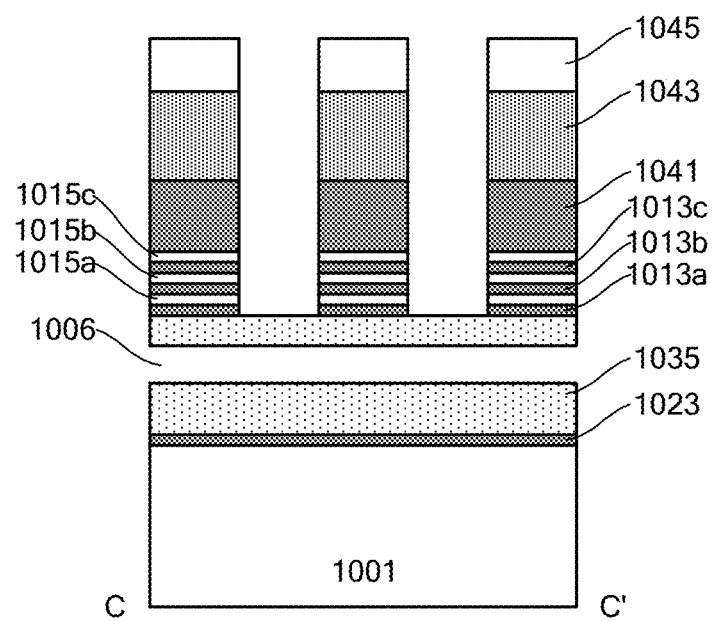
FIG. 22(b), FIG. 23(b), FIG. 24(b), FIG. 25(b), FIG. 26(b), and FIG. 27(c) are cross-sectional views taken along line CC'.
Figure 22C:
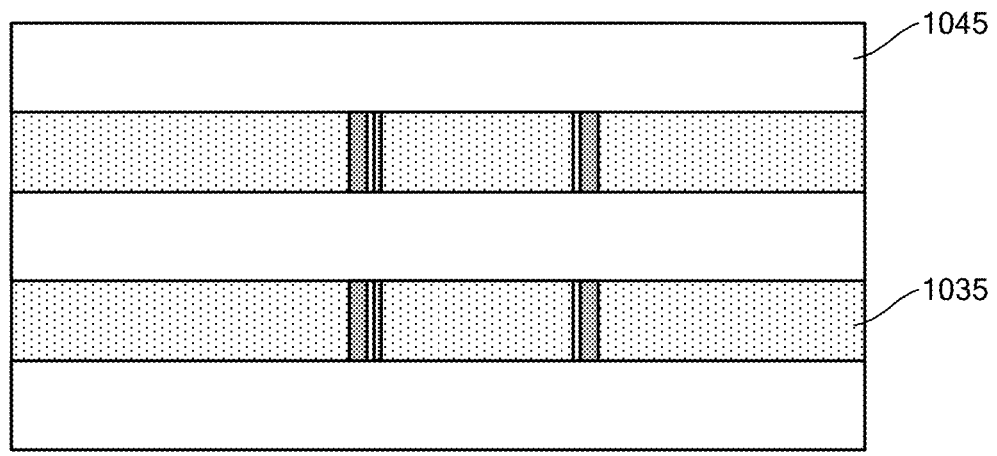

The sacrificial gate layer 1041 may be patterned into a stripe shape extending in a second direction (a horizontal direction on a paper surface in the drawing) intersecting (e.g., perpendicular to) the first direction so as to form the sacrificial gate. For example, as shown in FIG. 21(a) and FIG. 21 (b), a photoresist 1045 may be formed on the hard mask layer 1043 and patterned into stripe shapes extending in the second direction (see a top view in FIG. 21(b)). Then, as shown in FIG. 22(a), FIG. 22(b) and FIG. 22(c), the hard mask layer 1043 and the sacrificial gate layer 1041 may be selectively etched sequentially by, for example, RIE, by using the photoresist 1045 as a mask. Thus, the sacrificial gate layer 1041 is patterned into stripe shapes extending in the second direction. In addition, the channel layer and the sacrificial layer exposed by the removal of the sacrificial gate layer 1041 in the stack layer may also be selectively etched sequentially, such as RIE, so that the stack layer is left below the sacrificial gate layer 1041. The semiconductor layer 1025 may also be etched to form a fin left below the sacrificial gate layer 1041. The etching may be stopped at the isolation layer 1035 of the oxide. After that, the photoresist 1045 may be removed.

As shown in FIG. 22(b), the current sacrificial gate layer 1041 and the sacrificial layers 1013a, 1013b, 1013c surround the channel layers 1015a, 1015b, 1015c, thus define a space subsequently used for the gate stack.

Figure 23A:
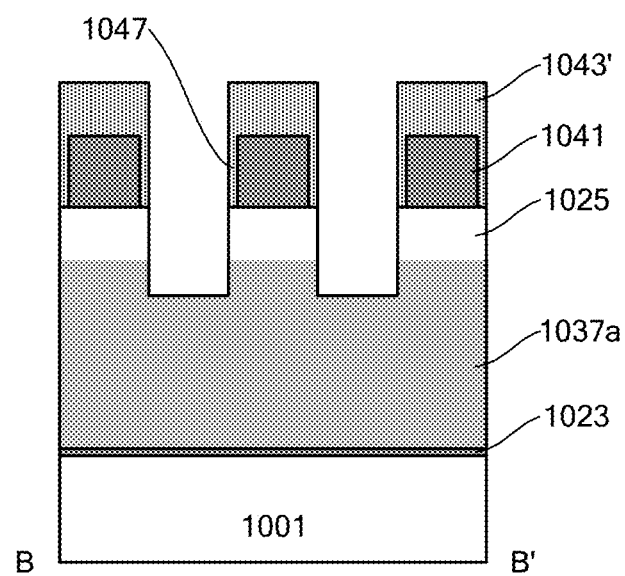
Figure 23B:
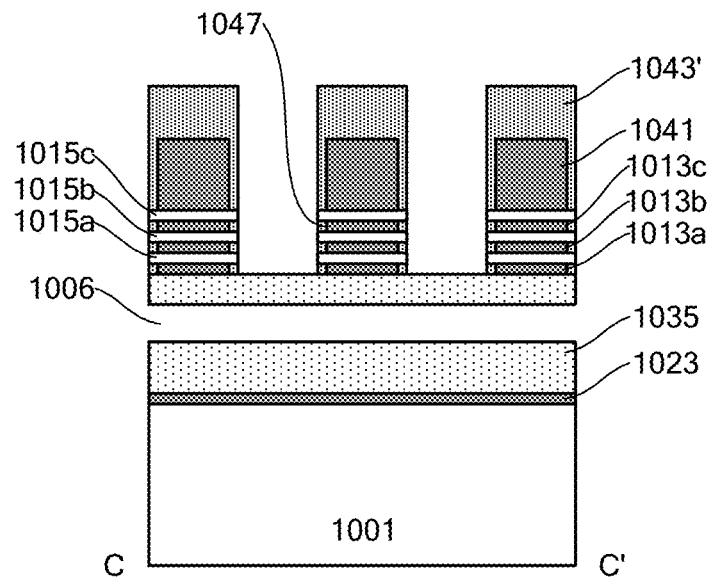

A gate spacer may be formed on sidewalls of the sacrificial gate layer 1041, and the sacrificial layers 1013a, 1013b, and 1013c. For example, as shown in FIG. 23(a) and FIG. 23(b), the sacrificial gate layer 1041 and the sacrificial layers 1013a, 1013b, 1013c may be recessed by a certain recess depth of, for example, about 2 nm to 7 nm (relative to the channel layers 1015a, 1015b, 1015c) by a selective etching. In order to control the recess depth, an Atomic Layer Etching (ALE) may be used. A dielectric material may be filled in the recess thus formed to form a gate spacer 1047. The filling may be formed by, for example, depositing a nitride with a thickness of about 3 nm to 10 nm and then performing RIE on the deposited nitride (until a surface of the channel layer is exposed). Here, the hard mask layer 1043, which is also an nitride, may be integrated with the gate spacer on the sidewall of the sacrificial gate layer 1041, and may thus be marked as 1043'.

According to the process, the gate spacer 1047 may be self-aligned and formed on the sidewall of the sacrificial gate layer 1041 and the sacrificial layers 1013*a*, 1013*b*, 1013*c*, but not formed on the sidewall of the channel layers 1015*a*, 1015*b*, 1015*c*. The gate spacer 1047 may have a substantially uniform thickness which, for example, depends on the depth of the above-mentioned recess. In addition, an outer sidewall of the gate spacer 1047 may be substantially vertically aligned with the outer sidewall of the channel layers 1015*a*, 1015*b*, 1015*c*, and an inner sidewall of the gate spacer 1047 may be substantially aligned in the vertical direction (by controlling the etch depth to be substantially the same at each position when forming the recess).

After that, source/drain portions connected with the sidewalls of the semiconductor layer 1025 and the channel layers 1015*a*, 1015*b*, and 1015*c* may be formed on two sides of the sacrificial gate layer 1041.

Figure 24A:
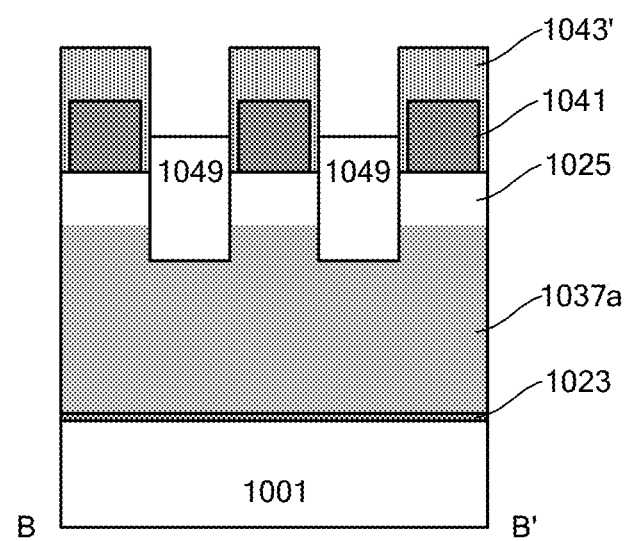
Figure 24B:
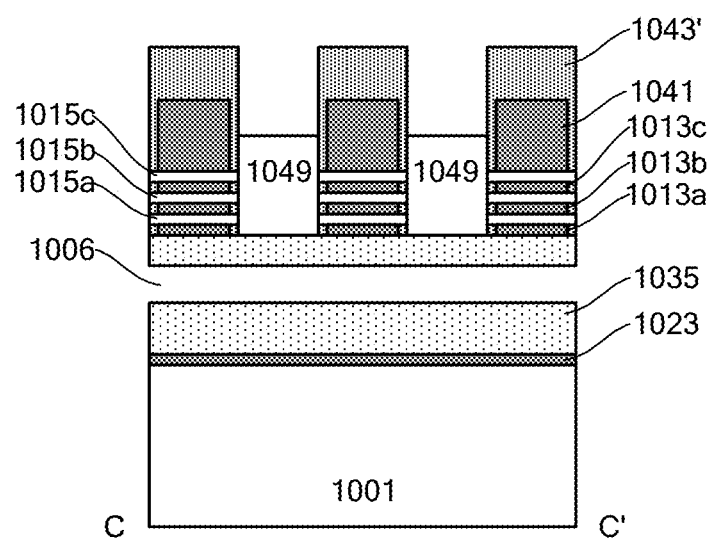

As shown in FIG. 24(*a*) and FIG. 24 (*b*), source/drain portions 1049 may be formed by, for example, an epitaxial growth. The source/drain portions 1049 may be grown from a surface of the exposed semiconductor layer 1025 and surfaces of the channel layers 1015*a*, 1015*b*, 1015*c*. The grown source/drain portions 1049 are connected with the surface of the semiconductor layer 1025 and the sidewalls of the channel layers 1015*a*, 1015*b*, and 1015*c*. During the growth, the source/drain portion 1049 may be in-situ doped to a conductivity type corresponding to the device to be formed, e.g., an n-type for an n-type device and a p-type for a p-type device, and a doping concentration may be about $1E19$ $cm^{-3}$ to $1E21$ $cm^{-3}$. The grown source/drain portion 1049 may contain a different material (e.g., having a different lattice constant) from that of the semiconductor layer and the channel layer, so as to apply a stress to the channel layer. For example, for an n-type device, the source/drain portion 1049 may contain Si:C (an atomic percent of C is, for example, about 0.1% to 5%); for a p-type device, the source/drain portion 1049 may contain SiGe (an atomic percent of Ge is, for example, about 20% to 75%). When the n-type device and the p-type device are simultaneously formed on the substrate, for example, in a case of a CMOS process, the source/drain portions may be grown separately for the n-type device and the p-type device. When source/drain portions of one type of device is grown, a region of another type of device may be shielded by a shielding layer such as a photoresist or the like.

Currently, the same source/drain portion 1049 is connected to the semiconductor layer 1025 and the channel layers 1015*a*, 1015*b*, 1015*c* on two opposite sides. That is, the devices on the two sides are currently electrically connected together. An electrical isolation may be provided between devices according to the design layout.

Figure 25A:
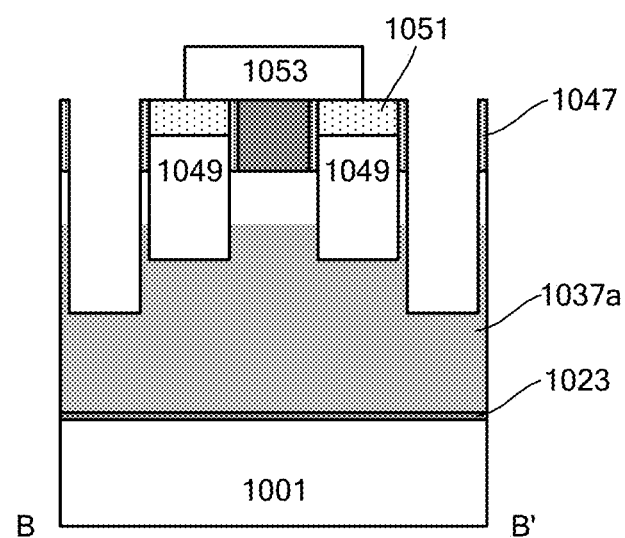
Figure 25B:
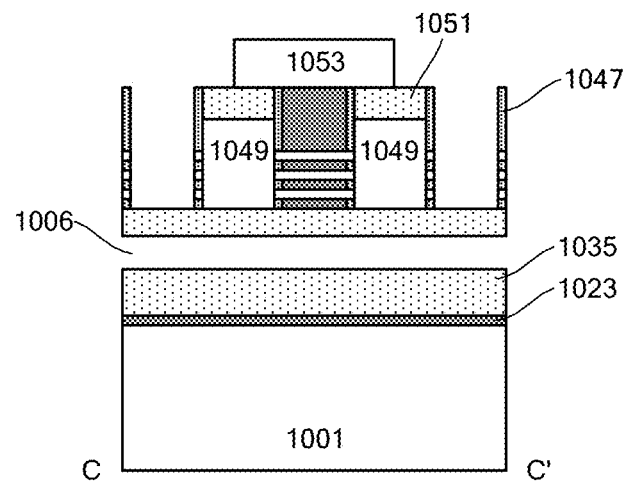
Figure 26A:
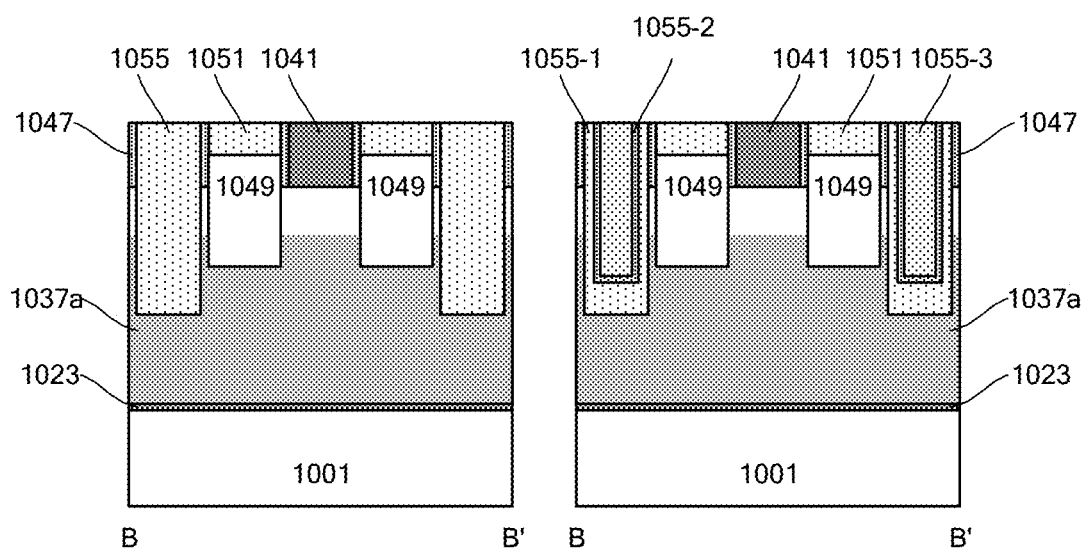
Figure 26B:
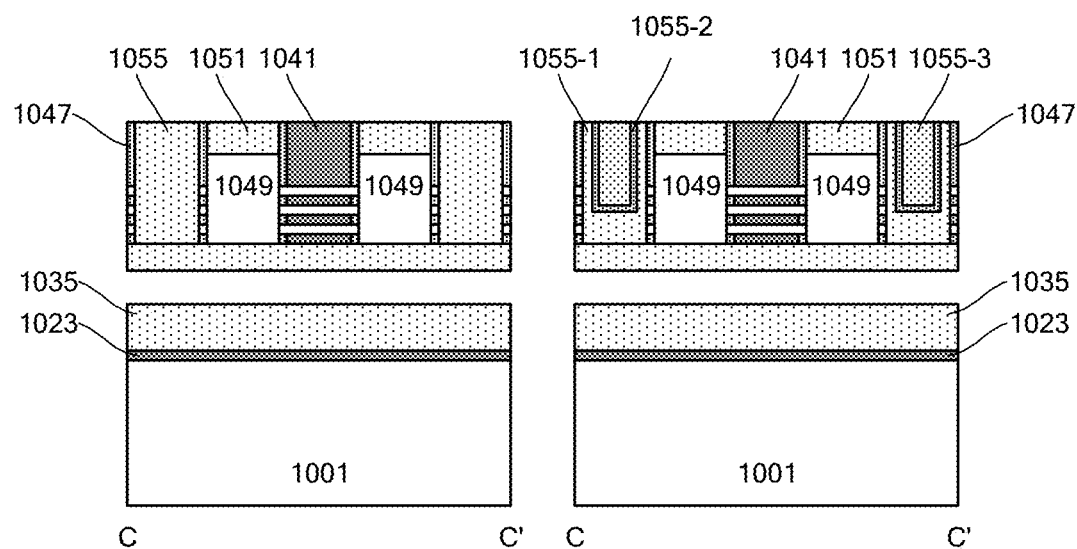
Figure 26C:

For example, as shown in FIG. 25(*a*) and FIG. 25(*b*), a dielectric material 1051 such as an oxide may be deposited on the substrate 1001 to cover the sacrificial gate layer 1041, the source/drain portions 1049 and the isolation layer 1035. A planarization process such as CMP may be performed on the dielectric material 1051 to expose the sacrificial gate layer 1041. A photoresist 1053 may be formed on the dielectric material 1051 and patterned to shield one or more sacrificial gate layers 1041, and exposing other sacrificial gate layers 1041. In this example, the sacrificial gate layer 1041 in the middle is shielded, while the sacrificial gate layer 1041 on two sides is exposed. The exposed sacrificial gate layer 1041, and the semiconductor layer 1025, the channel layers and the sacrificial layers located below may be selectively etched sequentially by, for example, RIE, thereby leaving a space between the gate spacers 1047. The etching may proceed into the PTSs 1037*a*, 1037*b* to achieve a good electrical isolation. After that, the photoresist 1053 may be removed. As shown in left portions of each of FIG. 26(*a*) and FIG. 26(*b*) as well as FIG. 26(*c*), a dielectric material 1055, such as an oxide, may be filled in the space left. The filling of the dielectric material 1055 may include deposition and then planarization.

According to other embodiments of the present disclosure, a multilayer dielectric layer may be formed in the above-mentioned space by, for example, a sequential deposition. For example, as shown in right portions of each of FIG. 26(*a*) and FIG. 26(*b*), a stacked structure of multilayer dielectrics 1055-1, 1055-2, 1055-3 may be formed. According to the embodiment, the dielectric layer 1055-1 may contain an oxide, the dielectric layer 1055-2 may contain a nitride, and the dielectric layer 1055-3 may contain an oxynitride. However, the present disclosure is not limited to this. For example, more or fewer dielectric layers may be formed, and the dielectric layers may contain other materials.

Next, a replacement gate process may be performed to complete a device manufacturing.

Figure 27A:
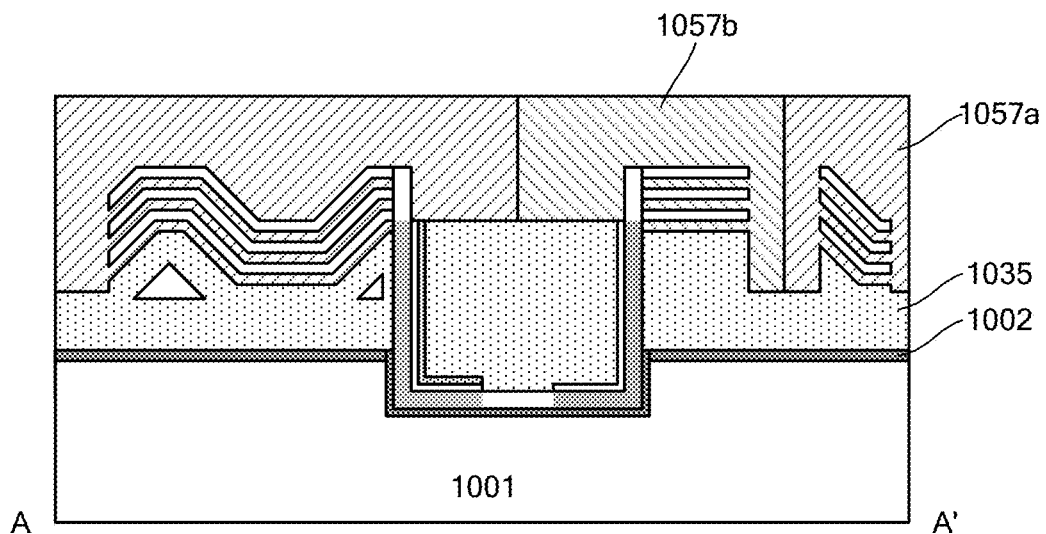
Figure 27B:
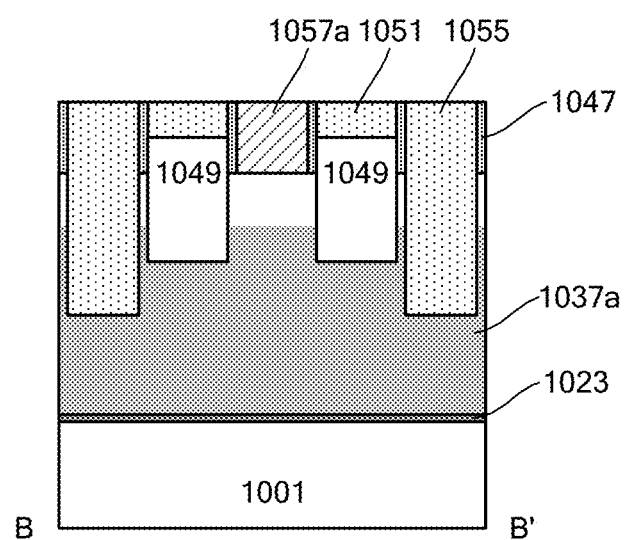
Figure 27C:
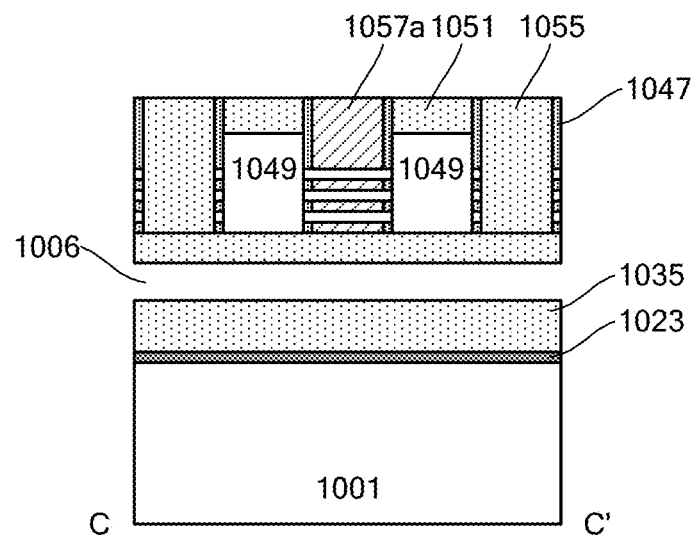

For example, as shown in FIG. 27(*a*), FIG. 27(*b*) and FIG. 27(*c*), the sacrificial gate layer 1041 and the sacrificial layers 1013*a*, 1013*b*, and 1013*c* may be removed by a selective etching (as described above, they may be removed by the same etching recipe), so that a space may be formed inside the gate spacer 1047, and a gate stack may be formed in the space. In this example, a p-type device and an-type device are simultaneously formed on the substrate, so different gate stacks 1057*a*, 1057*b* may be formed for the p-type device and n-type device, respectively. For example, they have work functions different from each other. For example, after a first gate stack for one type of device is formed, a region of the type of device may be shielded by a shielding layer such as a photoresist. A first gate stack existing in a region of another type of device may be removed (only a gate conductor layer may be removed), and then a second gate stack for the another type of device may be formed. For example, the gate stack 1057*a* for the p-type device may include a gate dielectric layer 1057*a*-1 and a gate conductor layer 1057*a*-2, and the gate stack 1057*b* for the n-type device may include a gate dielectric layer 1057*b*-1 and a gate conductor layer 1057*b*-2 (see FIG. 28 (*a*), FIG. 28 (*b*) and FIG. 28(*c*)). The gate dielectric layers 1057*a*-1, 1057*b*-1 may be formed in a substantially conformal manner, with a thickness of, for example, about 2 nm to 5 nm, and may include a high-k gate dielectric such as $HfO_2$. Before the high-k gate dielectric is formed, an interface layer may also be formed on the surface of the channel layer, e.g., an oxide formed by an oxidation process or deposition such as an Atomic Layer Deposition (ALD), with a thickness of about 0.2 nm to 2 nm. The gate conductor layers 1057*a*-2, 1057*b*-2 may contain a work function adjustment metal such as TiN, TaN, etc., and a gate conductive metal such as W, etc.

Figure 28A:
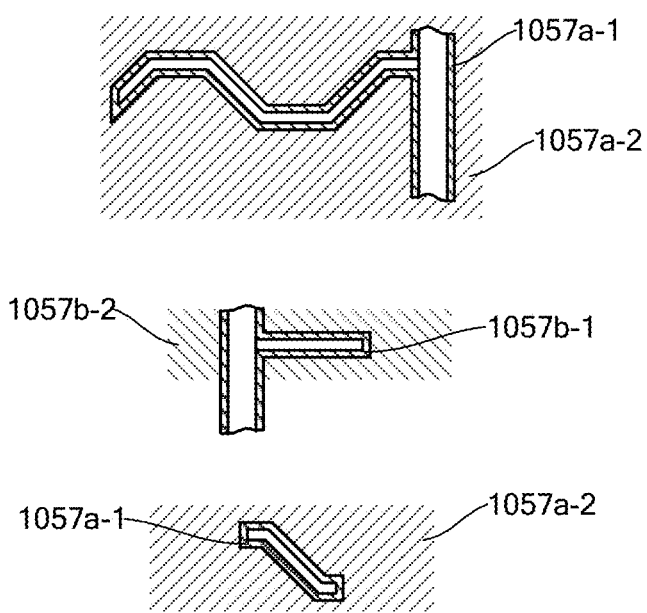
FIG. 28(a), FIG. 28(b) and FIG. 28(c) are enlarged views of gate stack portions around a channel layer.
Figure 28B:
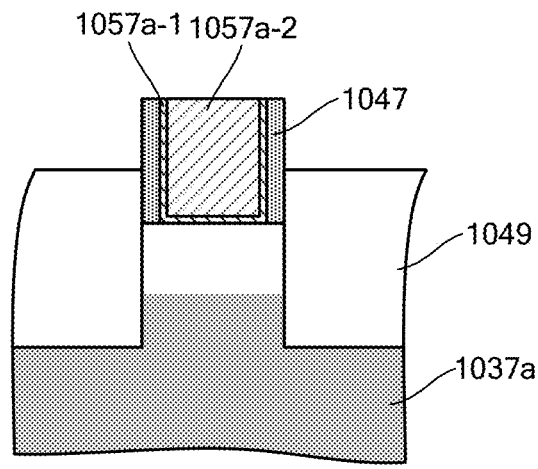
Figure 28C:
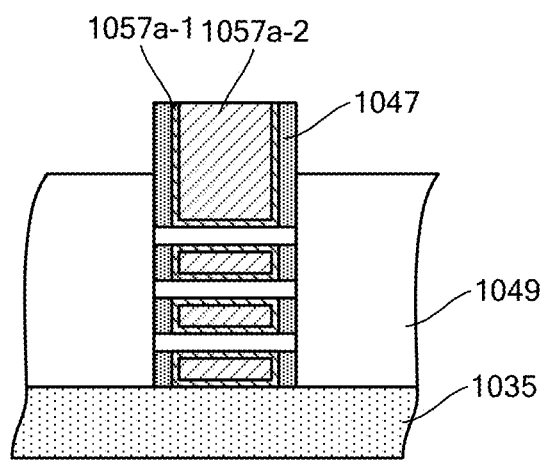

FIG. 28(*a*), FIG. 28(*b*) and FIG. 28(*c*) more clearly show the gate stack portions around the semiconductor layer 1025 and the channel layers in an enlarged form. It may be shown that the gate stack is located inside the gate spacer 1047 surrounding each of the channel layers 1015*a*, 1015*b* and 1015*c*. The channel layers 1015*a*, 1015*b*, and 1015*c* are connected to the source/drain portions 1049 on two sides, respectively, and a channel is formed between the source/drain portions 1049. In addition, the gate stack may surround the sidewall and the top surface of the upper portion of the semiconductor layer 1025, the semiconductor layer 1025 is also connected to the source/drain portions 1049 on two sides, and a channel is formed between the source/drain portions 1049, which is similar to a FinFET.

According to the embodiments of the present disclosure, due to an existence of the channel layers with the inclined portions, the channel layers 1015a, 1015b, 1015c are more mechanically stable e.g., are not easily bent or adhered during the removal of the sacrificial layers 1013a, 1013b, 1013c, which is beneficial to improve a yield rate.

In addition, as shown in FIG. 27(*a*), the gate stacks of current devices are continuous with each other, so that respective gates of the devices are electrically connected to each other. An electrical isolation may be provided between the devices according to the design layout.

Figure 29A:
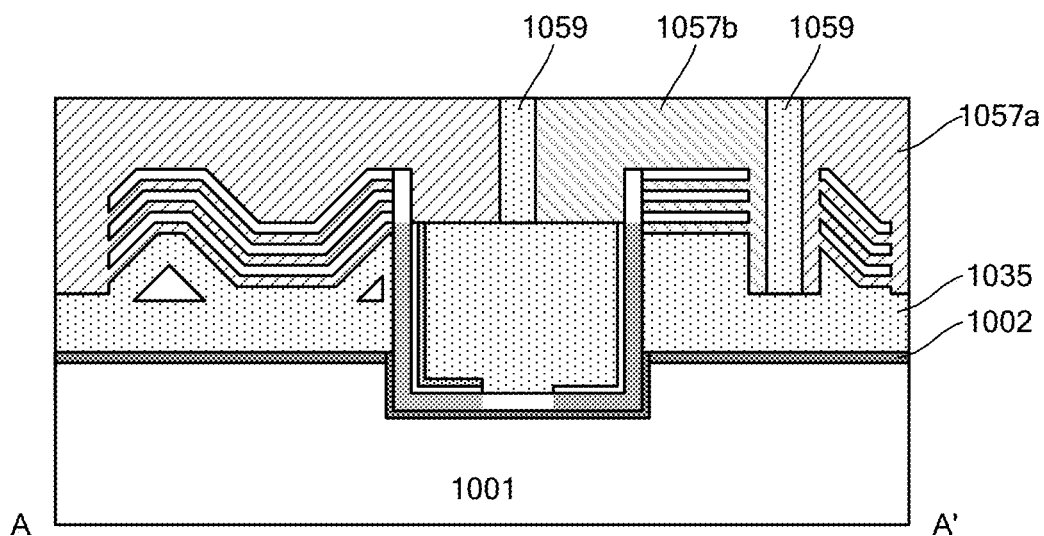
Figure 29B:
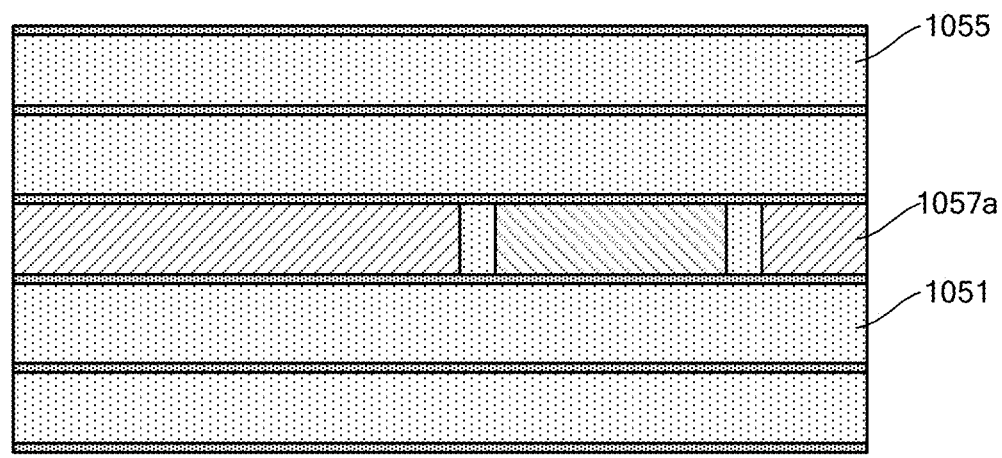

For example, as shown in FIG. 29(*a*) and FIG. 29(*b*), a photoresist (not shown) may be formed on the dielectric materials 1051, 1055 to expose the gate stacks 1057a, 1057b between device regions to be isolated, while the rest of the gate stacks 1057a, 1057b are shielded. After that, the exposed gate stacks 1057a, 1057b (especially the gate conductor layers 1057a-2, 1057b-2) may be selectively etched such as RIE. The etching may be stopped at the isolation layer 1035 (or stopped at the gate dielectric layers 1057a-1, 1057b-1) located below. A dielectric material 1059 such as an oxide may be filled in a space left by an etching of the exposed portions of the gate stacks 1057a, 1057b. The filling of the dielectric material 1059 may include deposition and then planarization.

In the above-mentioned embodiments, the vertical structure not only plays a supporting role, but is also used to form a device channel. However, the present disclosure is not limited to this. For example, the vertical structure may only function as a support portion.

FIG. 30 to FIG. 36(*b*) show schematic diagrams of some stages in a process of manufacturing a semiconductor device according to another embodiment of the present disclosure. Differences from the above-mentioned embodiments will be mainly described below.

Figure 30:
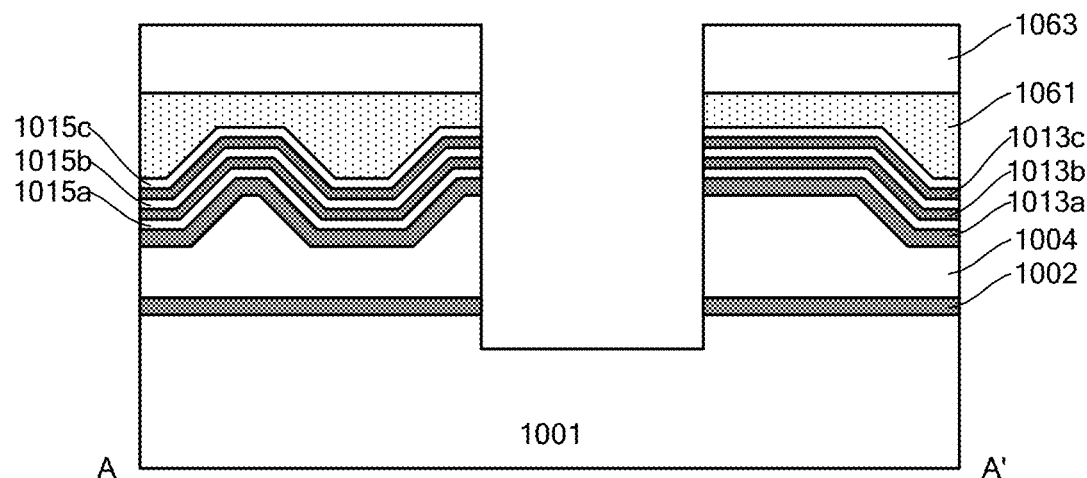

The processes described above with reference to FIG. 1 to FIG. 7 may be performed, so that an alternating stack layer of sacrificial layers 1013a, 1013b, 1013c and channel layers 1015a, 1015b, 1015c may be formed on the position maintaining layer 1004. In the above-mentioned embodiments, the first trench may be formed in stages. In contrast, in the embodiment, there is no need to consider the vertical structure being used as the channel portion, so the first trench may be simply formed. For example, as shown in FIG. 30, an oxide layer 1061 (with a thickness of, for example, about 10 nm to 200 nm) may be formed on the top surface of the stack layer and planarized such as CMP. A photoresist 1063 may be formed on a top surface of the oxide layer 1061 and patterned to expose a region (a region to form the first trench) between some adjacent devices. The oxide layer 1061 and each layer in the stack layer are selectively etched sequentially, such as RIE, by using the photoresist 1063 as a mask, so as to form a first trench penetrating the stack layer. As mentioned above, the first trench may extend into the substrate 1001, so that a subsequently formed vertical structure may be connected to the substrate 1001 and thus may be used as a support structure to support the stack layer. After that, the photoresist 1063 may be removed.

Figure 31:
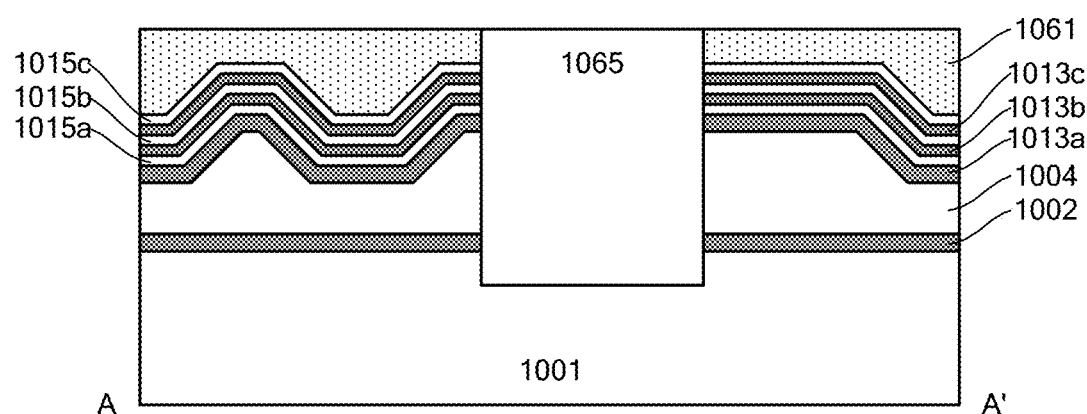

As shown in FIG. 31, a dielectric material 1065, such as SiC, may be formed on the substrate 1001 by, for example, deposition. The dielectric material 1065 may be used to fill the first trench and may cover the oxide layer 1061. A planarization process such as CMP may be performed on the deposited dielectric material 1065 and may be stopped at the oxide layer 1061. The dielectric material 1065 filled in the first trench may form a vertical structure that is used as a support portion.

Figure 32:
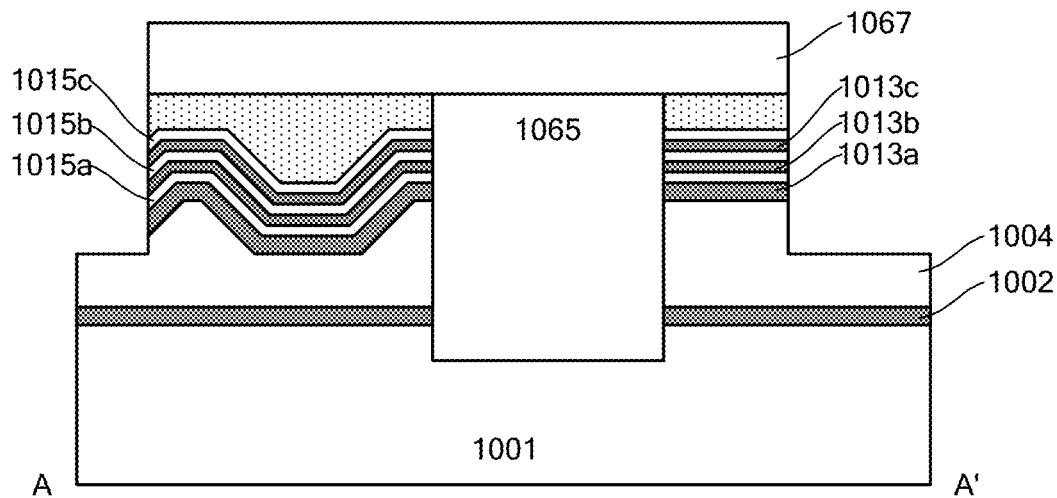

Next, a replacement of the position maintaining layer 1004 may be performed. The replacement process may be the same as that in the above-mentioned embodiments. For example, as shown in FIG. 32, a photoresist 1067 may be formed on the oxide layer 1061 and the dielectric material 1065 and patterned to expose a region (a region to form a second trench) between some adjacent device regions. Each layer in the stack layer (and each material layer above the stack layer) may be selectively etched sequentially, such as RIE, by using the photoresist 1067 as a mask, so as to form the second trench. Here, the RIE may proceed into the position maintaining layer 1004 so as to access the position maintaining layer 1004 through the second trench, but the RIE does not reach the position defining layer 1002 (which may avoid that the position maintaining layer 1004 may not be replaced due to being completely shielded by a protective layer in a case of forming the protective layer below). After that, the photoresist 1067 may be removed.

Figure 33:
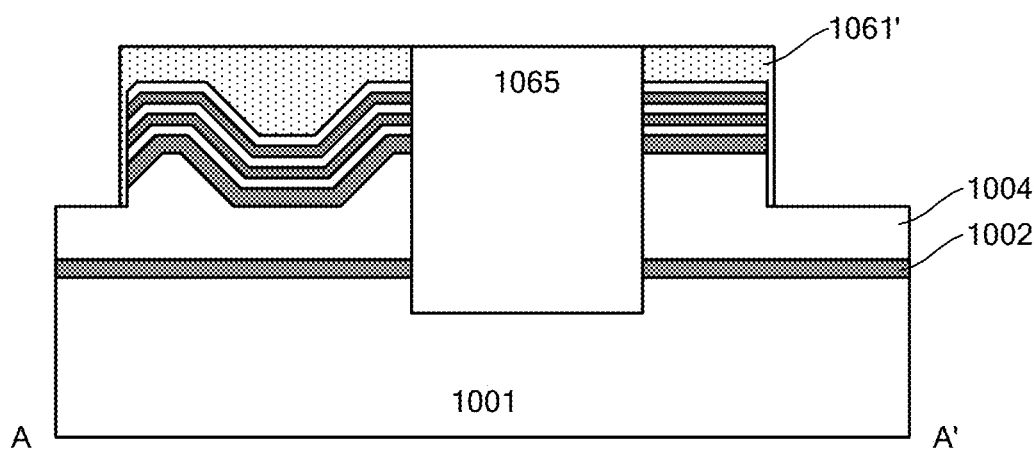

In order to protect the stack layer, especially the channel layer therein (especially in this example, both the channel layer and the position maintaining layer 1004 contain Si) during the removal of the position maintaining layer 1004, a protective layer may be formed on the sidewall of the stack layer. For example, as shown in FIG. 33, a protective layer may be formed on the exposed sidewall of the stack layer through a spacer formation process. In this example, the protective layer may contain an oxide, and may thus be shown integrally with the dielectric material 1061, which is also an oxide, as 1061'.

Figure 34:
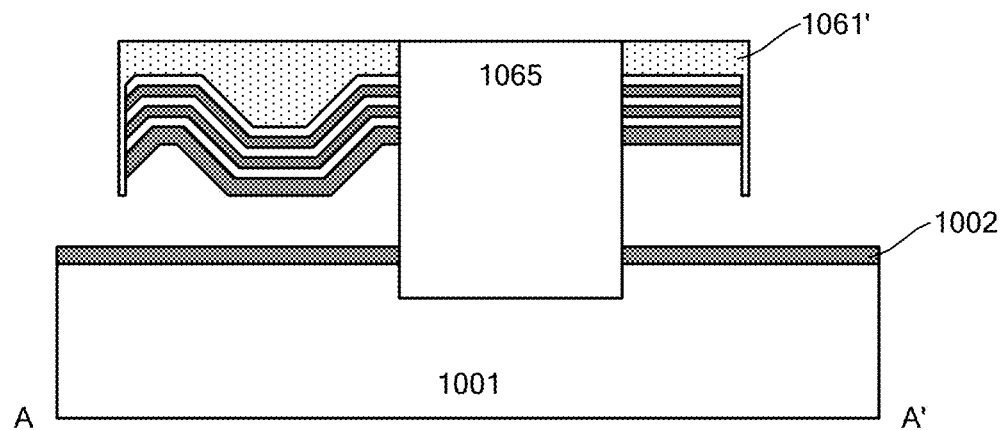

As shown in FIG. 34, the position maintaining layer 1004 may be removed by a selective etching. On one hand, the vertical structure 1065 may suspend the stack layer relative to the substrate 1001; on the other hand, the second trench may form a processing channel for etching the position maintaining layer 1004 located below the stack layer. For example, the position maintaining layer 1004 (Si in this example) may be selectively etched relative to the vertical structure 1065 (SiC in this example), the position defining layer 1002 and the sacrificial layer 1013a (SiGe in this example) by using a TMAH solution.

Figure 35:
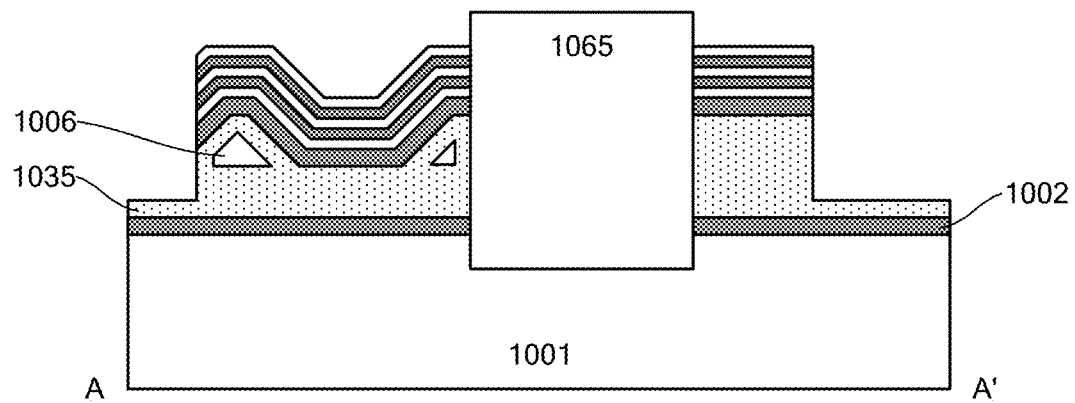

After that, an isolation layer may be formed by filling with a dielectric. As shown in FIG. 35, a space below the stack layer may be may be filled a dielectric material through the second trench so as to form an isolation layer 1035. For the filling, reference may be made to the above-mentioned description in combination with FIG. 18. In this example, a top surface of the isolation layer 1035 may be as low as to expose the sidewall of each layer in the stack layer, since there is no need to consider a fin. For example, the top surface of the isolation layer 1035 may be higher than the position defining layer 1002 for an effective isolation, and may be lower than the lowermost surface of the stack layer for a subsequent processing (e.g., the removal of the sacrificial layer) of the stack layer. It may be shown that, on one hand, the isolation layer 1035 is disposed between adjacent devices to form an electrical isolation such as a Shallow Trench Isolation (STI) between the adjacent devices; on the other hand, the isolation layer 1035 is disposed below the channel portion so as to suppress a leakage between a source and a drain in the same device.

In this example, the third trench is not formed. Adjacent devices may be separated from each other by the first trench and the second trench.

Figure 36A:
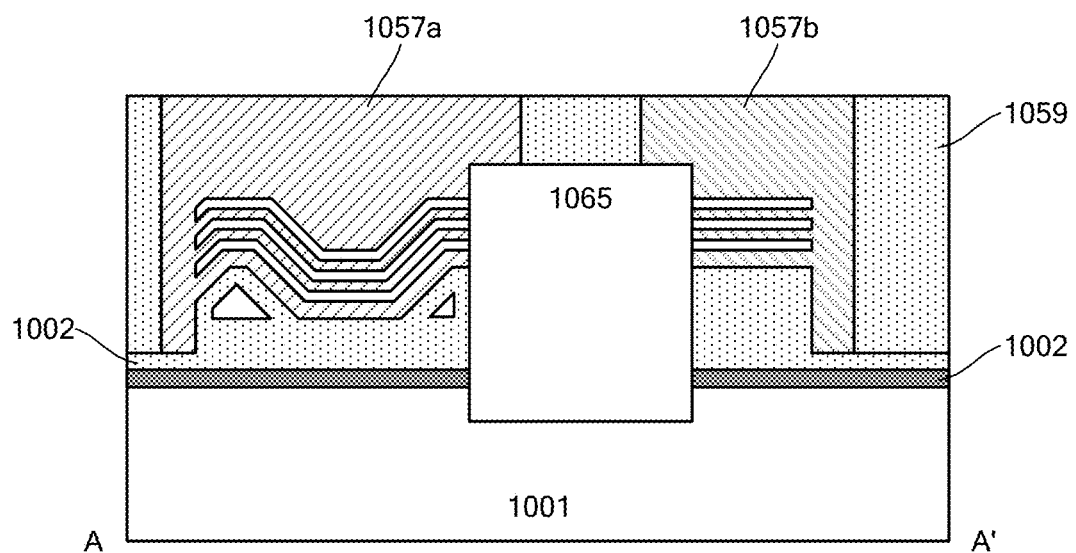
Figure 36B:
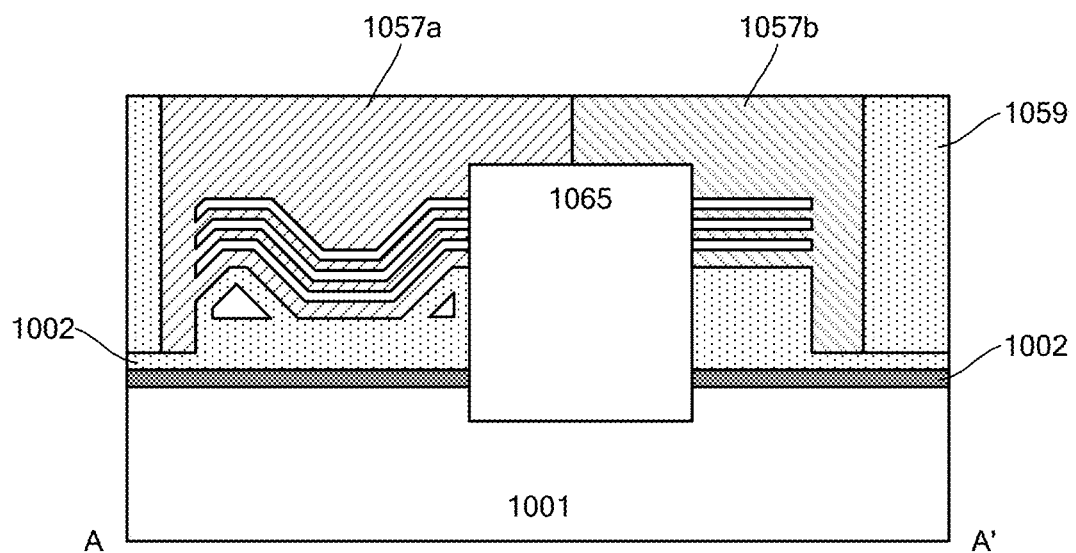

After that, the semiconductor device shown in FIG. 36(a) or FIG. 36(b) may be obtained by the processes described above with reference to FIG. 20 to FIG. 29(b). FIG. 36(a) shows a case where respective gate electrodes of adjacent p-type and n-type devices are electrically isolated, and FIG. 36(b) shows a case where respective gate electrodes of adjacent p-type and n-type devices are electrically connected to form a CMOS configuration.

The semiconductor device according to the embodiments of the present disclosure may be applied to various electronic apparatuses. For example, an integrated circuit (IC) may be formed based on the semiconductor device, and thus an electronic apparatus may be constructed. Accordingly, the present disclosure further provides an electronic apparatus including the above-mentioned semiconductor device. The electronic apparatus may further include a display screen cooperating with the integrated circuit, a wireless transceiver cooperating with the integrated circuit, and other components. The electronic apparatus may include, for example, a smart phone, a computer, a Personal Computer (PC), an artificial intelligence apparatus, a wearable apparatus, a mobile power supply, etc.

According to the embodiments of the present disclosure, there is further provided a method of manufacturing a System on Chip (SoC). The method may include the above-mentioned method. In particular, various devices may be integrated on a chip, and at least some of which are manufactured according to the method of the present disclosure.

In the above descriptions, technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments have been described above separately, this does not mean that the measures in the various embodiments may not be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor device, comprising:
a vertical structure extending in a vertical direction relative to a substrate; and
a nanosheet extending from the vertical structure and spaced apart from the substrate in the vertical direction, wherein the nanosheet comprises a first portion in a first orientation, and at least one of an upper surface and a lower surface of the first portion is not parallel to a horizontal surface of the substrate,
wherein the nanosheet further comprises a second portion extending in a direction parallel to the substrate.

2. The semiconductor device according to claim 1, wherein the second portion of the nanosheet is in a second orientation different from the first orientation.

3. The semiconductor device according to claim 1, wherein
the horizontal surface of the substrate is one of {100} crystal plane families, and the at least one of the upper surface and the lower surface of the first portion of the nanosheet is one of {110} crystal plane families; or
the horizontal surface of the substrate is one of {110} crystal plane families, and the at least one of the upper surface and the lower surface of the first portion of the nanosheet is one of {100} crystal plane families.

4. The semiconductor device according to claim 2, wherein
the horizontal surface of the substrate is one of {100} crystal plane families, the at least one of the upper surface and the lower surface of the first portion of the nanosheet is one of {110} crystal plane families, and at least one of an upper surface and a lower surface of the second portion of the nanosheet is one of the {100} crystal plane families; or
the horizontal surface of the substrate is one of {110} crystal plane families, the at least one of the upper surface and the lower surface of the first portion of the nanosheet is one of {100} crystal plane families, and at least one of an upper surface and a lower surface of the second portion of the nanosheet is one of the {110} crystal plane families.

5. The semiconductor device according to claim 1, comprising: a plurality of nanosheets comprising the nanosheet, wherein each of the nanosheets extends from the vertical structure, spaced apart from the substrate in the vertical direction, and spaced apart from each other in the vertical direction;
wherein a spacing distance between adjacent nanosheets in the plurality of nanosheets is substantially uniform.

6. The semiconductor device according to claim 1, wherein the nanosheet is in a shape of a broken line with one or more inflection points.

7. The semiconductor device according to claim 1, wherein the vertical structure comprises a semiconductor material;
wherein a plurality of the semiconductor devices are provided on the substrate, respective vertical structures of at least one pair of adjacent semiconductor devices in the plurality of semiconductor devices face with each other, and respective nanosheets extend away from corresponding vertical structures; and
wherein the respective vertical structures of the adjacent semiconductor devices are portions facing with each other in a same semiconductor layer.

8. The semiconductor device according to claim 1, wherein the vertical structure comprises a dielectric material;
wherein a plurality of the semiconductor devices are provided on the substrate, respective vertical structures of at least one pair of adjacent semiconductor devices in the plurality of semiconductor devices are integral with each other, and respective nanosheets extend away from the integrated vertical structure.

9. The semiconductor device according to claim 1, further comprising:
source/drain portions on the substrate located on two opposite sides of the nanosheet in a first direction and connected with the nanosheet;
a gate stack on the substrate extending in a second direction and overlapping with the nanosheet, wherein the second direction intersects the first direction; and
a dielectric layer disposed between the gate stack and the substrate;
wherein the dielectric layer comprises an air gap.

10. The semiconductor device according to claim 9, further comprising a gate spacer disposed on a sidewall of the gate stack, wherein the gate spacer comprises a first portion above the nanosheet and a second portion below the nanosheet;
  wherein the first portion of the gate spacer has a thickness substantially the same as a thickness of the second portion of the gate spacer; and
  wherein an inner sidewall of the first portion of the gate spacer and an inner sidewall of the second portion of the gate spacer are substantially aligned with each other in the vertical direction.

11. The semiconductor device according to claim 10, wherein
  a plurality of the semiconductor devices are provided on the substrate, and semiconductor devices adjacent in the first direction in the plurality of semiconductor devices are electrically isolated from each other by an isolation portion, wherein a range of the isolation portion in the first direction is defined by a dummy gate spacer extending in the second direction.

12. The semiconductor device according to claim 11, wherein a range of a top portion of the source/drain portion of the semiconductor device in the first direction is defined by the gate spacer of the semiconductor device and the dummy gate spacer.

13. The semiconductor device according to claim 11, further comprising:
  a semiconductor layer aligned with the dummy gate spacer in the vertical direction and corresponding to the nanosheet.

14. The semiconductor device according to claim 9, wherein,
  a plurality of the semiconductor devices are provided on the substrate, and semiconductor devices adjacent in the first direction in the plurality of semiconductor devices are electrically isolated from each other by an isolation portion, wherein the isolation portion extends in the second direction.

15. The semiconductor device according to claim 14, wherein the source/drain portion extends in the second direction, and
  the semiconductor device further comprises: a gate spacer located between the gate stack and the source/drain portion and a dummy gate spacer located between the source/drain portion and the isolation portion, wherein the gate spacer has a thickness substantially the same as a thickness of the dummy gate spacer in the first direction.

16. The semiconductor device according to claim 14, wherein the isolation portion comprises a multilayer dielectric material.

17. The semiconductor device according to claim 14, wherein respective vertical structures of the semiconductor devices adjacent in the first direction are aligned with each other.

18. The semiconductor device according to claim 9, wherein the vertical structure comprises a semiconductor material, the source/drain portion is connected with the vertical structure on two opposite sides of the vertical structure in the first direction, and the gate stack overlaps with at least an upper portion of the vertical structure.

19. The semiconductor device according to claim 18, further comprising a punch-through stopper formed at a lower portion of the vertical structure;
wherein:
  the semiconductor device is an n-type device, and the punch-through stopper is a p-type doped region in the vertical structure; or
  the semiconductor device is a p-type device, and the punch-through stopper is an n-type doped region in the vertical structure.

20. An electronic apparatus comprising the semiconductor device according to claim 1, wherein the electronic apparatus comprises a smartphone, a computer, a tablet computer, an artificial intelligence apparatus, a wearable apparatus, or a mobile power supply.

21. A semiconductor device, comprising:
  a first device and a second device on a substrate, wherein the first device comprises a first vertical structure extending in a vertical direction relative to the substrate, and a first nanosheet extending from the first vertical structure and spaced apart from the substrate in the vertical direction, and the second device comprises a second vertical structure extending in the vertical direction relative to the substrate, and a second nanosheet extending from the second vertical structure and spaced apart from the substrate in the vertical direction,
  wherein the first nanosheet comprises a first portion in a first orientation, and the second nanosheet comprises a second portion in a second orientation different from the first orientation,
  wherein the first nanosheet further comprises a third portion extending in a direction parallel to the substrate.

22. The semiconductor device according to claim 21, wherein
  a horizontal surface of the substrate is one of {100} crystal plane families, at least one of an upper surface and a lower surface of the first portion of the first nanosheet is one of {110} crystal plane families, and at least one of an upper surface and a lower surface of the second portion is one of the {100} crystal plane families; or
  a horizontal surface of the substrate is one of {110} crystal plane families, at least one of an upper surface and a lower surface of the first portion of the first nanosheet is one of {100} crystal plane families, and at least one of an upper surface and a lower surface of the second portion of the second nanosheet is one of the {110} crystal plane families.

23. The semiconductor device according to claim 21, wherein the first device comprises a plurality of the first nanosheets spaced apart from each other in the vertical direction, and the second device comprises a plurality of the second nanosheets spaced apart from each other in the vertical direction.

24. The semiconductor device according to claim 23, wherein a spacing distance between adjacent nanosheets in the first nanosheets is substantially uniform, and a spacing distance between adjacent nanosheets in the second nanosheets is substantially uniform;
  wherein the first nanosheet and the second nanosheet at a same level relative to the substrate comprise substantially a same material and have substantially a same thickness; and
  wherein a distance between the first nanosheets at adjacent levels relative to the substrate is substantially the same as a distance between the second nanosheets at corresponding adjacent levels.

25. The semiconductor device according to claim 21, wherein the first device and the second device are adjacent to each other, and the first nanosheet and the second nanosheet extend away from the first vertical structure and the second vertical structure, respectively.

26. The semiconductor device according to claim 25, wherein the first vertical structure and the second vertical structure are integral with each other;
    wherein the first vertical structure and the second vertical structure integral with each other comprise a dielectric material.

27. The semiconductor device according to claim 21, further comprising:
    first source/drain portions located on two opposite sides of the first nanosheet in a first direction and connected with the first nanosheet;
    a first gate stack on the substrate extending in a second direction and overlapping with the first nanosheet, wherein the second direction intersects the first direction;
    second source/drain portions located on two opposite sides of the second nanosheet in the first direction and connected with the second nanosheet; and
    a second gate stack on the substrate extending in the second direction and overlapping with the second nanosheet.

28. The semiconductor device according to claim 27, wherein
    the first device and the second device are adjacent to each other in the second direction,
    the first vertical structure is a first fin of a semiconductor material, the second vertical structure is a second fin of the semiconductor material, and the first nanosheet and the second nanosheet extend away from the first fin and the second fin in the second direction, respectively,
    the first fin and the second fin face with each other in the second direction, and the first fin and the second fin are portions of a same semiconductor layer on the substrate located on two opposite sides in the second direction, respectively, and
    the first source/drain portion is further connected with the first fin, and the second source/drain portion is further connected with the second fin.

29. The semiconductor device according to claim 28, further comprising:
    a first punch-through stopper formed below the first fin in the semiconductor layer; and
    a second punch-through stopper formed below the second fin in the semiconductor layer.

30. The semiconductor device according to claim 27, wherein
    the first device and the second device are adjacent to each other in the second direction,
    the first gate stack is aligned with the second gate stack in the second direction, and
    the first nanosheet is aligned with the second nanosheet in the second direction.

31. The semiconductor device according to claim 30, further comprising:
    a gate spacer extending continuously on a sidewall of the first gate stack, a sidewall of the second gate stack, and between the first gate stack and the second gate stack.

32. A method of manufacturing a semiconductor device, comprising:
    forming a position maintaining layer on a substrate;
    forming a pattern on the position maintaining layer, wherein the pattern comprises a first surface in a first orientation, and the first surface is not parallel to a horizontal surface of the substrate;
    forming a stack layer of alternately arranged sacrificial layer and channel layer on the position maintaining layer formed with the pattern;
    forming a first trench extending in a first direction in the stack layer, wherein the first trench extends into the substrate;
    forming a vertical structure connected with the channel layer in the first trench; and
    forming a second trench extending in a second direction in the stack layer, wherein the second direction intersects the first direction, the second trench exposes the position maintaining layer, and the first trench and the second trench define a stripe-shaped portion of the stack layer extending in the first direction,
    wherein the pattern further comprises a second surface parallel to the substrate.

33. The method according to claim 32, further comprising:
    removing the position maintaining layer through the second trench;
    forming an isolation layer on the substrate;
    forming a sacrificial gate layer on the isolation layer, wherein the sacrificial gate layer extends in the second direction to intersect the stripe-shaped portion of the stack layer;
    selectively etching the stripe-shaped portion of the stack layer by using the sacrificial gate layer as a mask;
    forming, on two opposite sides in the first direction of the etched stripe-shaped portion of the stack layer, a semiconductor layer for forming source/drain portions; and
    replacing the sacrificial gate layer and the sacrificial layer in the stack layer with a gate stack.

34. The method according to claim 32, wherein the second surface of the pattern is in a second orientation different from the first orientation;
    wherein:
        the horizontal surface of the substrate is one of {100} crystal plane families, and the first orientation is one of {110} crystal plane families; or
        the horizontal surface of the substrate is one of {110} crystal plane families, and the first orientation is one of {100} crystal plane families.

35. The method according to claim 32, wherein the forming a pattern comprises:
    forming a stepped pattern on the position maintaining layer by etching a surface of the position maintaining layer; and
    performing an ion etching on the surface of the position maintaining layer having the stepped pattern, so as to form an inclined surface on the surface of the position maintaining layer.

36. The method according to claim 32, further comprising:
    forming a position defining layer on the substrate, wherein the position maintaining layer is formed on the position defining layer;
    wherein forming the first trench comprises:
        forming an initial trench having initial sidewalls opposite to each other in the second direction;
        forming a protective layer on a sidewall of the stack layer exposed in the initial trench;
        etching back the initial sidewall of the initial trench exposed by the protective layer, so that the etched back sidewall is recessed relative to the initial sidewall covered by the protective layer; and
        forming another position defining layer in the recess; and wherein removing the position maintaining layer comprises:
    selectively etching the position maintaining layer relative to the position defining layer, the another position defining layer, and the lowermost sacrificial layer of the stack layer.

37. The method according to claim 32, wherein forming the vertical structure comprises:
    substantially conformally forming a semiconductor layer along an inner wall of the first trench;
wherein forming the vertical structure further comprises:
    forming a dopant source layer on the semiconductor layer, and the method further comprises:
    selectively etching the dopant source layer after forming the isolation layer, so that the dopant source layer is kept below a top surface of the isolation layer; and
    driving a dopant in the dopant source layer into the semiconductor layer so as to form a punch-through stopper.

\* \* \* \* \*